United States Patent
Yang et al.

(10) Patent No.: US 11,862,722 B2
(45) Date of Patent: Jan. 2, 2024

(54) SEMICONDUCTOR DEVICE STRUCTURES AND METHODS OF MANUFACTURING THE SAME

(71) Applicant: INNOSCIENCE (SUZHOU) TECHNOLOGY CO., LTD., Suzhou (CN)

(72) Inventors: Chao Yang, Zhuhai (CN); Chunhua Zhou, Zhuhai (CN); Qiyue Zhao, Zhuhai (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 358 days.

(21) Appl. No.: 17/252,283

(22) PCT Filed: Sep. 9, 2020

(86) PCT No.: PCT/CN2020/114196
§ 371 (c)(1),
(2) Date: Dec. 15, 2020

(87) PCT Pub. No.: WO2022/051932
PCT Pub. Date: Mar. 17, 2022

(65) Prior Publication Data
US 2022/0310834 A1   Sep. 29, 2022

(51) Int. Cl.
*H01L 29/778* (2006.01)
*H01L 29/10* (2006.01)
(Continued)

(52) U.S. Cl.
CPC ...... *H01L 29/7787* (2013.01); *H01L 29/1087* (2013.01); *H01L 29/1095* (2013.01); *H01L 29/2003* (2013.01); *H01L 29/66462* (2013.01)

(58) Field of Classification Search
CPC ......... H01L 29/66431; H01L 29/66462; H01L 29/778–7789; H01L 2924/13064; H01L 29/122–127; H01L 29/15–158
See application file for complete search history.

(56) References Cited

U.S. PATENT DOCUMENTS

2013/0075751 A1*  3/2013  Imanishi ............ H01L 29/7787
257/E21.403
2014/0225161 A1   8/2014  Okita et al.
(Continued)

FOREIGN PATENT DOCUMENTS

CN   101465372 A   6/2009
CN   104051522 A   9/2014
(Continued)

OTHER PUBLICATIONS

First Office Action of the corresponding China patent application No. 202080003476.4 dated Aug. 27, 2021.
(Continued)

*Primary Examiner* — Charles D Garber
*Assistant Examiner* — Cole Leon Lindsey
(74) *Attorney, Agent, or Firm* — McCoy Russell LLP

(57) ABSTRACT

Semiconductor device structures and methods for manufacturing the same are provided. The semiconductor device structure includes a substrate, a first nitride semiconductor layer, a second nitride semiconductor layer, a barrier layer, a third nitride semiconductor layer and a gate structure. The first nitride semiconductor layer is disposed on the substrate. The second nitride semiconductor layer is disposed on the first nitride semiconductor layer and has a bandgap greater than that of the first nitride semiconductor layer. The barrier layer is disposed on the second nitride semiconductor layer and has a bandgap greater than that of the second nitride semiconductor layer. The third nitride semiconductor layer is doped with impurity and disposed on the barrier layer. The
(Continued)

gate structure is disposed on the third nitride semiconductor layer.

11 Claims, 22 Drawing Sheets

(51) Int. Cl.
    *H01L 29/20*     (2006.01)
    *H01L 29/66*     (2006.01)

(56) References Cited

U.S. PATENT DOCUMENTS

| | | | |
|---|---|---|---|
| 2015/0349108 A1* | 12/2015 | Fujita | H01L 29/7786 257/76 |
| 2020/0105917 A1 | 4/2020 | Okita et al. | |
| 2021/0320199 A1* | 10/2021 | Liu | H01L 29/1066 |

FOREIGN PATENT DOCUMENTS

| | | |
|---|---|---|
| CN | 205752162 U | 11/2016 |
| CN | 108155099 A | 6/2018 |
| CN | 110190116 A | 8/2019 |
| JP | 2009054623 A | 3/2009 |
| JP | 2011210750 A | 10/2011 |

OTHER PUBLICATIONS

International Search Report and Written Opinion of the corresponding PCT application No. PCT/CN2020/114196 dated May 26, 2021.

* cited by examiner

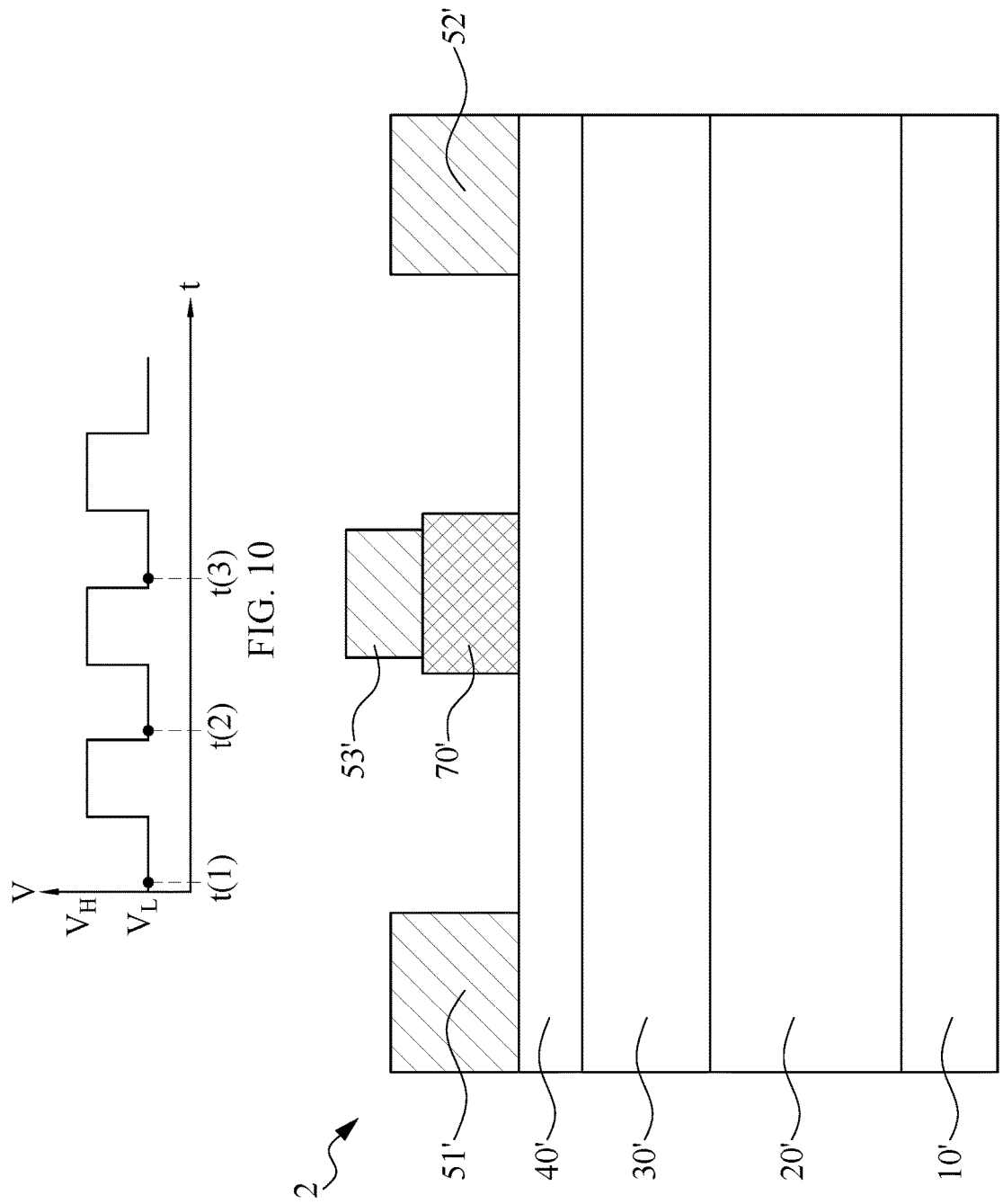

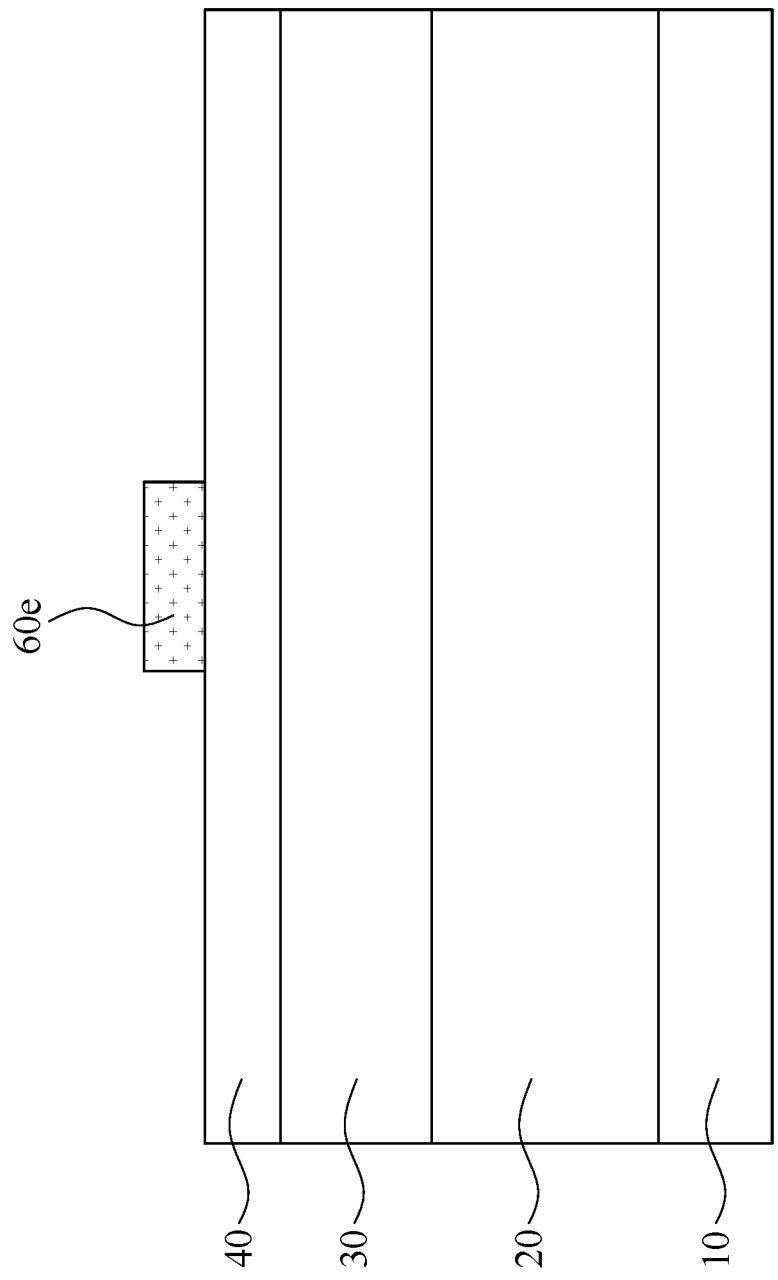

SEMICONDUCTOR DEVICE STRUCTURES AND METHODS OF MANUFACTURING THE SAME

BACKGROUND

1. Field of the Disclosure

The present disclosure relates to a semiconductor device structure and more particularly to a semiconductor device structure with a barrier layer between a gate structure and a nitride semiconductor layer.

2. Description of Related Art

Components including direct bandgap semiconductors, for example, semiconductor components including group III-V materials or group III-V compounds (Category: III-V compounds) can operate or work under a variety of conditions or in a variety of environments (e.g., at different voltages and frequencies).

The semiconductor components may include a heterojunction bipolar transistor (HBT), a heterojunction field effect transistor (HFET), a high-electron-mobility transistor (HEMT), a modulation-doped FET (MODFET) and the like.

SUMMARY

According to some embodiments of the present disclosure, a semiconductor device structure includes a substrate, a first nitride semiconductor layer, a second nitride semiconductor layer, a barrier layer, a third nitride semiconductor layer and a gate structure. The first nitride semiconductor layer is disposed on the substrate. The second nitride semiconductor layer is disposed on the first nitride semiconductor layer and has a bandgap greater than that of the first nitride semiconductor layer. The third nitride semiconductor layer is doped with impurity and disposed on the second nitride semiconductor layer. The barrier layer is in contact with the third nitride semiconductor layer and has a bandgap greater than that of the second nitride semiconductor layer. The gate structure is disposed on the third nitride semiconductor layer.

According to some embodiments of the present disclosure, a semiconductor device structure includes a substrate, a first nitride semiconductor layer, a second nitride semiconductor layer, a third nitride semiconductor layer, a barrier layer and a gate structure. The first nitride semiconductor layer is disposed on the substrate. The second nitride semiconductor layer is disposed on the first nitride semiconductor layer and has a bandgap greater than that of the first nitride semiconductor layer. The third nitride semiconductor layer is disposed on the second nitride semiconductor layer. The third nitride semiconductor layer includes a first surface adjacent to the second nitride semiconductor layer and a second surface far from the second nitride semiconductor layer. The gate structure is disposed on the second surface of the third nitride semiconductor layer. The barrier layer is disposed between the gate structure and the second nitride semiconductor layer. The barrier layer has a bandgap greater than that of the second nitride semiconductor layer.

According to some embodiments of the present disclosure, a method of manufacturing a semiconductor device structure includes: providing a substrate; forming a first nitride semiconductor layer on the substrate; forming a second nitride semiconductor layer on the first nitride semiconductor layer, wherein the second nitride semiconductor layer has a bandgap greater than that of the first nitride semiconductor layer; forming a third nitride semiconductor layer on the second nitride semiconductor layer; forming a barrier layer on the third nitride semiconductor layer, wherein the barrier layer has a bandgap greater than that of the second nitride semiconductor layer; and forming a gate structure on the third nitride semiconductor layer.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 10 is a waveform schematic of voltage of a comparative semiconductor device structure.

FIG. 10A, FIG. 10B and FIG. 10C illustrate states of distribution of hole(s) of a comparative semiconductor device structure at different times.

FIG. 13A, FIG. 13B and FIG. 13C illustrate various stages of a method for manufacturing a semiconductor device structure in accordance with some embodiments of the present disclosure.

Figure 1:
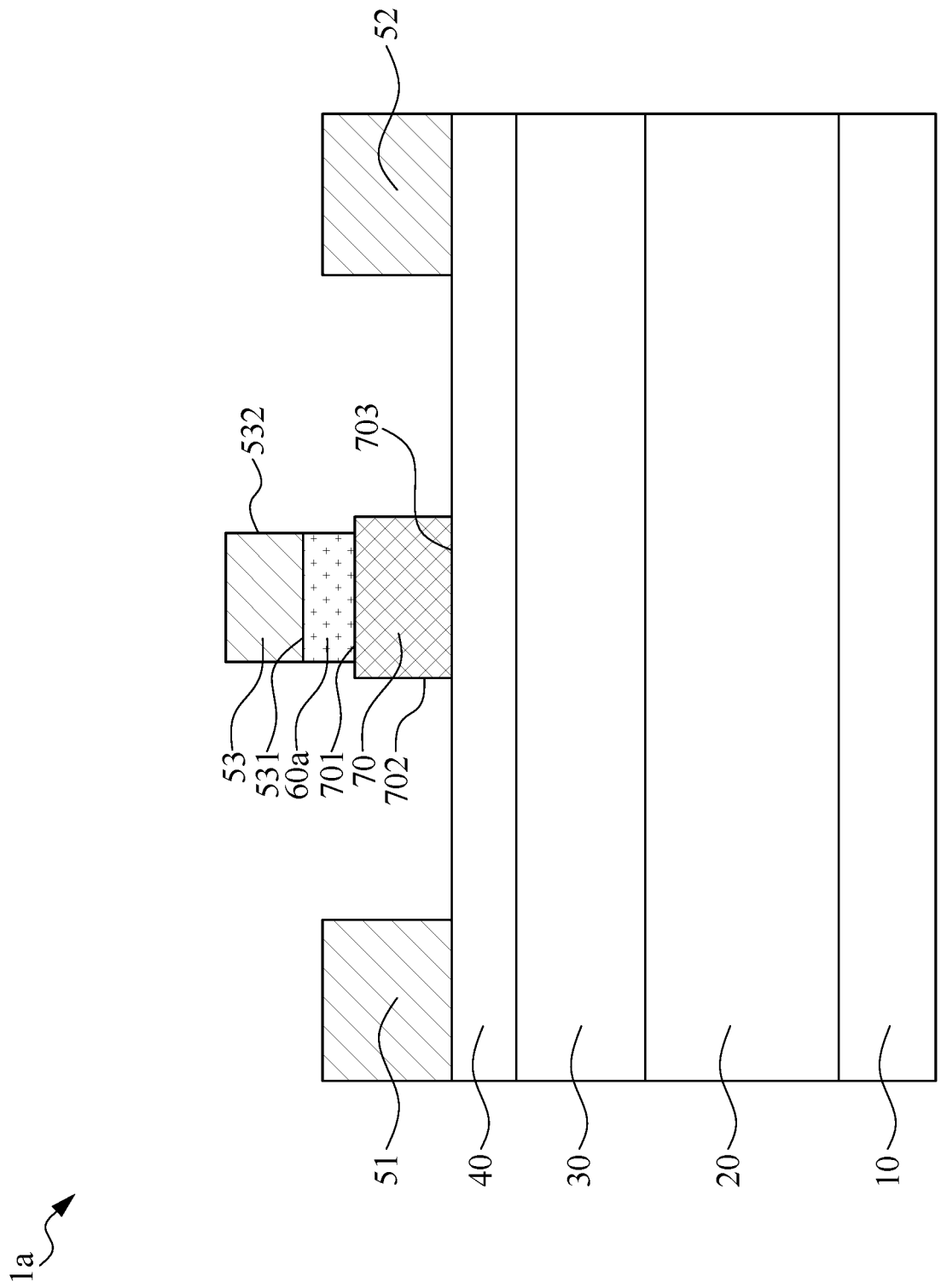
FIG. 1 is a cross-sectional view of a semiconductor device structure in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail as follows. It should be appreciated, however, that the present disclosure provides many applicable concepts that can be embodied in a wide variety of specific contexts. The specific embodiments discussed are merely illustrative and do not limit the scope of the disclosure.

The present disclosure provides a semiconductor device structure including a barrier layer (or a hole barrier layer) with a bandgap greater than that of AlGaN. The barrier layer may restrain hole(s) being extracted by the gate structure through the depletion layer, and thus the reliability of the semiconductor device structure may be enhanced under high temperature reverse bias (HTRB). The barrier layer may restrain hole(s) accumulating in the depletion layer, and thus the reliability of the semiconductor device structure may be enhanced under high temperature gate bias (HTGB). The semiconductor device structure of the present disclosure can be applied in, without limitation, HEMT devices, especially in low voltage HEMT devices, high voltage HEMT devices and radio frequency (RF) HEMT devices.

FIG. 1 is a cross-sectional view of a semiconductor device structure 1a in accordance with some embodiments of the present disclosure. The semiconductor device structure 1a may include a substrate 10, a buffer layer 20, a nitride semiconductor layer 30, a nitride semiconductor layer 40, an electrode 51, an electrode 52, a gate structure 53, a barrier layer 60a and a nitride semiconductor layer 70.

The substrate 10 may include, without limitation, silicon (Si), doped Si, silicon carbide (SiC), germanium silicide (SiGe), gallium arsenide (GaAs), or other semiconductor materials. The substrate 10 may include, without limitation, sapphire, silicon on insulator (SOI), or other suitable materials.

The buffer layer 20 may be disposed on the substrate 10. The buffer layer 20 may be configured to reduce defect due to the dislocation between the substrate 10 and the nitride semiconductor layer 30. The buffer layer 20 may include, but is not limited to, nitride, such as AlN, AlGaN or the like.

The nitride semiconductor layer 30 may be disposed on the buffer layer 20. The nitride semiconductor layer 30 may include a group III-V layer. The nitride semiconductor layer 30 may include, but is not limited to, a group III nitride, for example, a compound $In_aAl_bGa_{1-a-b}N$, in which a+b≤1. The group III nitride further includes, but is not limited to, for example, a compound $Al_aGa_{(1-a)}N$, in which a≤1. The nitride semiconductor layer 30 may include a gallium nitride (GaN) layer. GaN has a bandgap of about 3.4 eV. The thickness of the nitride semiconductor layer 30 may range, but is not limited to, from about 0.5 μm to about 10 μm.

The nitride semiconductor layer 40 may be disposed on the nitride semiconductor layer 30. The nitride semiconductor layer 40 may include a group III-V layer. The nitride semiconductor layer 40 may include, but is not limited to, a group III nitride, for example, a compound $In_aAl_bGa_{1-a-b}N$, in which a+b≤1. The group III nitride may further include, but is not limited to, for example, a compound $Al_aGa_{(1-a)}N$, in which a≤1. The nitride semiconductor layer 40 may have a greater bandgap than that of the nitride semiconductor layer 30. The nitride semiconductor layer 40 may include an aluminum gallium nitride (AlGaN) layer. AlGaN has a bandgap of about 4.0 eV. The thickness of the nitride semiconductor layer 40 may range, but is not limited to, from about 10 nm to about 100 nm.

A heterojunction is formed between the nitride semiconductor layer 40 and the nitride semiconductor layer 30, and the polarization of the heterojunction forms a two-dimensional electron gas (2DEG) region in the nitride semiconductor layer 30.

The electrode 51 (or a source electrode or a source structure) may be disposed on the nitride semiconductor layer 40. The electrode 51 may be in contact with the nitride semiconductor layer 40. The electrode 51 may include, for example, without limitation, a conductive material. The conductive materials may include metals, alloys, doped semiconductor materials (e.g., doped crystalline silicon), or other suitable conductive materials, such as Ti, Al, Ni, Cu, Au, Pt, Pd, W, TiN or other suitable materials. The electrode 51 may be electrically connected to ground. The electrode 51 may be electrically connected to virtual ground. The electrode 51 may be electrically connected to real ground.

The electrode 52 (or a drain electrode or a drain structure) may be disposed on the nitride semiconductor layer 40. The electrode 52 may be in contact with the nitride semiconductor layer 40. The electrode 52 may include, for example, without limitation, a conductive material. The conductive materials may include metals, alloys, doped semiconductor materials (e.g., doped crystalline silicon), or other suitable conductive materials, such as Ti, Al, Ni, Cu, Au, Pt, Pd, W, TiN or other suitable materials.

The nitride semiconductor layer 70 (or a depletion layer) may be disposed on the nitride semiconductor layer 40. The nitride semiconductor layer 70 may be in direct contact with the nitride semiconductor layer 40. The nitride semiconductor layer 70 may be doped with impurity. The nitride semiconductor layer 70 may include p-type dopants. It is contemplated that the nitride semiconductor layer 70 may include a p-doped GaN layer, p-doped AlGaN layer, p-doped AlN layer or other suitable III-V group layers. The p-type dopants may include magnesium (Mg), beryllium (Be), zinc (Zn) and cadmium (Cd).

The nitride semiconductor layer 70 may be configured to control the concentration of the 2DEG in the nitride semiconductor layer 30. The nitride semiconductor layer 70 can be used to deplete the 2DEG directly under the nitride semiconductor layer 70.

The nitride semiconductor layer 70 may include a surface 701 (or an upper surface), a surface 702 (or a side surface) and a surface 703 (or a lower surface). The surface 701 may be opposite the surface 703. The surface 702 may extend from the surface 701 to the surface 702. The surface 703 may be in contact with the nitride semiconductor layer 40.

The gate structure 53 may be disposed on the nitride semiconductor layer 70. The gate structure 53 may include a gate metal. The gate metal may include titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials.

The electrode 51 and the electrode 52 may be disposed on two opposite sides of the gate structure 53. Although the electrode 51 and the electrode 52 are disposed on two opposite sides of the gate structure 53 in FIG. 1, the electrode 51, the electrode 52, and the gate structure 53 may have different configurations in other embodiments of the present disclosure due to the design requirements.

Although it is not illustrated in FIG. 1, however, it is contemplated that structure of the electrode 51 can be varied or changed in some other embodiments of the subject application. Although it is not illustrated in FIG. 1, however, it is contemplated that structure of the electrode 52 can be varied or changed in some other embodiments of the subject application. For example, a portion of the electrode 51 may be located or extended in the nitride semiconductor layer 30. A portion of the electrode 52 may be located or extended in the nitride semiconductor layer 30. The electrode 51 may be disposed on the nitride semiconductor layer 30. The electrode 52 may be disposed on the nitride semiconductor layer 30. The electrode 51 may penetrate the nitride semiconductor layer 40 to contact the nitride semiconductor layer 30. The electrode 52 may penetrate the nitride semiconductor layer 40 to contact the nitride semiconductor layer 30.

The barrier layer 60a (or a hole barrier layer) may be disposed between the gate structure 53 and the nitride semiconductor layer 40. The barrier layer 60a may be disposed between the gate structure 53 and the nitride semiconductor layer 70. The nitride semiconductor layer 70 may be separated from the gate structure 53 by the barrier layer 60a. The barrier layer 60a may disposed on the nitride semiconductor layer 70. The barrier layer 60a may be disposed on the surface 701 of the nitride semiconductor layer 70. The barrier layer 60a may be in contact with the nitride semiconductor layer 70. The barrier layer 60a may be in contact with the surface 701 of the nitride semiconductor layer 70. The barrier layer 60a may not be in contact with the surface 702 of the nitride semiconductor layer 70. The barrier layer 60a may not be in contact with the surface 703 of the nitride semiconductor layer 70. A portion of the nitride semiconductor layer 70 may be exposed from the barrier layer 60a. A portion of the surface 701 of the nitride semiconductor layer 70 may be exposed from the barrier layer 60a. The gate structure 53 may be disposed on the barrier layer 60a. The gate structure 53 may be in contact with the barrier layer 60a. A surface 531 (or a lower surface) of the gate structure 53 may be in contact with the barrier layer 60a. The gate structure 53 may cover the barrier layer 60a. The gate structure 53 may completely cover the barrier layer 60a. A surface 532 (or a side surface) of the gate structure may be coplanar with the side surface of the barrier layer 60a.

The barrier layer 60a may have a bandgap greater than that of the nitride semiconductor layer 40. The barrier layer 60a may have a band gap of about 4.0 eV to about 4.5 eV. The barrier layer 60a may have a band gap of about 4.5 eV to about 5.0 eV. The barrier layer 60a may have a band gap of about 5.0 eV to about 5.5 eV. The barrier layer 60a may have a band gap of about 5.5 eV to about 6.0 eV. The barrier layer 60a may include gallium. The barrier layer 60a may include gallium oxide. Gallium oxide may include $Ga_2O_3$. The barrier layer 60a may include gallium oxynitride. Gallium oxynitride may include $GaO_xN_{1-x}$, wherein $0<x<1$. The barrier layer 60a may include diamond. The barrier layer 60a may include aluminum nitride. The barrier layer 60a may include a combination thereof. The bandgap of the barrier layer 60a may be greater than that of the nitride semiconductor layer 70.

The gate structure 53, barrier layer 60a and nitride semiconductor layer 70 may form a metal-insulator-semiconductor (MIS) structure. Compared to Schottky contact, MIS structure may assist in reducing leakage current and enhancing breakdown voltage. As a result, the gate voltage swing of the semiconductor device structure 1a can be improved.

Under high temperature gate bias (HTGB), hole(s) may flow into the nitride semiconductor layer 70 from the gate structure 53. As HTGB is performed on the gate structure, the threshold voltage may shift irreversibly due to accumulation of hole(s) in the depletion layer. As shown in FIG. 1, the barrier layer 60a may be disposed between the nitride semiconductor layer 70 and the gate structure 53. The barrier layer 60a has a bandgap greater than that of the nitride semiconductor layer 40, which restrains hole(s) flowing from the gate structure 53 to the nitride semiconductor layer 70 and prevent accumulation of hole(s) in the nitride semiconductor layer 70. As a result, the threshold voltage of the semiconductor device structure 1a may keep invariable.

Figure 2:
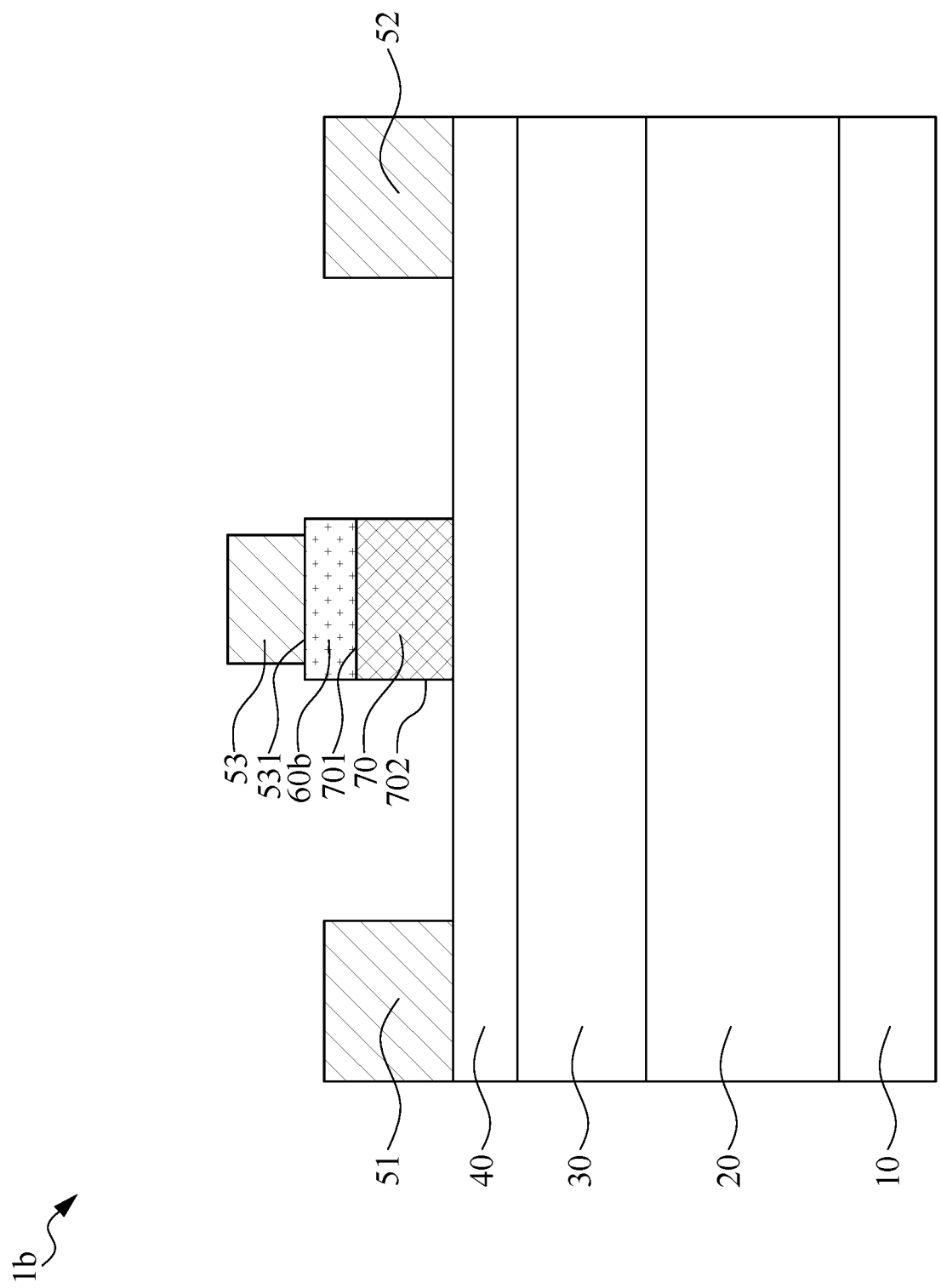
FIG. 2 is a cross-sectional view of a semiconductor device structure in accordance with some embodiments of the present disclosure.

FIG. 2 is a cross-sectional view of a semiconductor device structure 1b in accordance with some embodiments of the present disclosure. The semiconductor device structure 1b may have a structure similar to the semiconductor device structure 1a except that the barrier layer 60b of the semiconductor device structure 1b may completely cover the surface 701 of the nitride semiconductor layer 70. A portion of the barrier layer 60b may be exposed from the gate structure 53.

Figure 3:
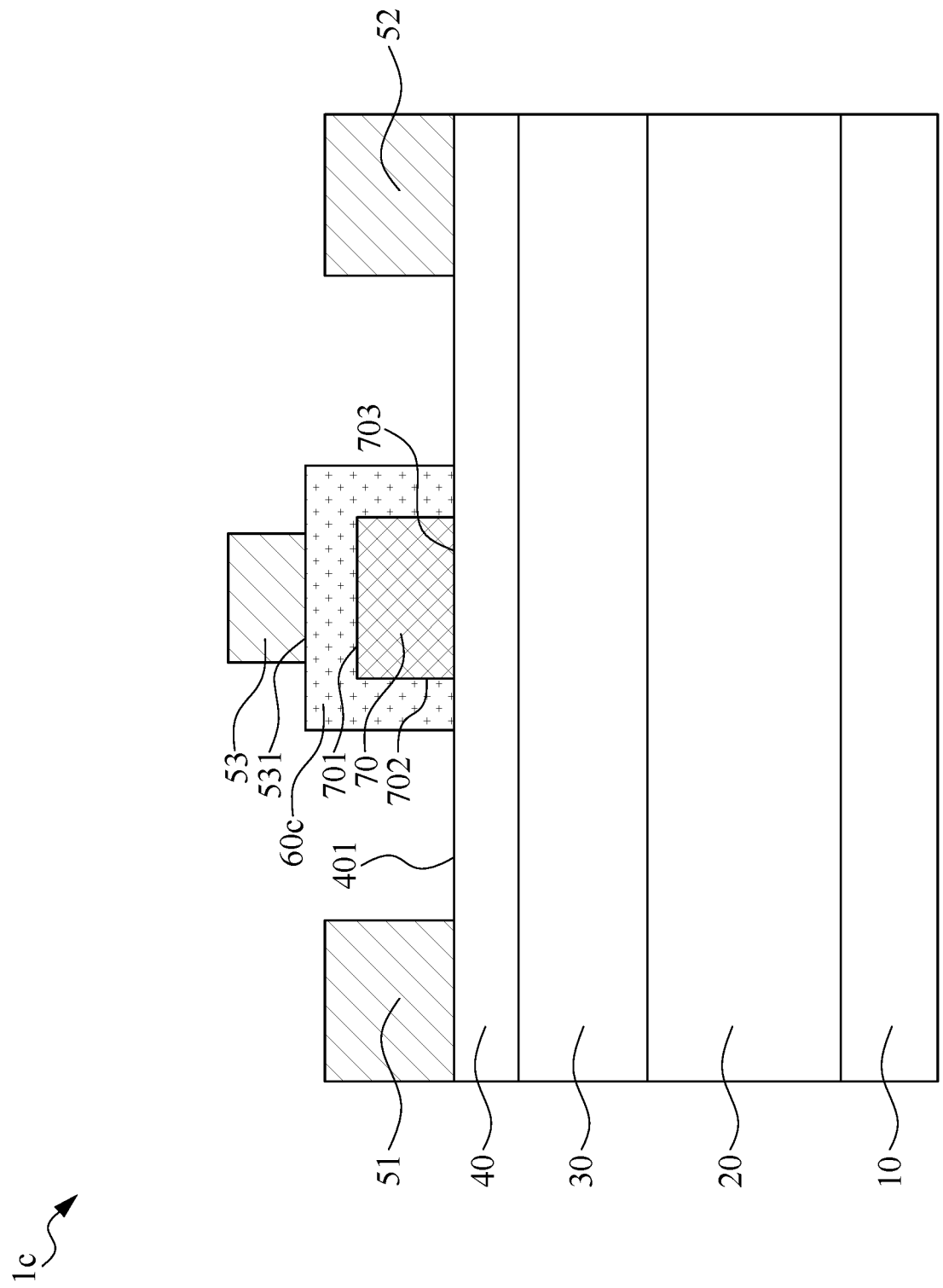
FIG. 3 is a cross-sectional view of a semiconductor device structure in accordance with some embodiments of the present disclosure.

FIG. 3 is a cross-sectional view of a semiconductor device structure 1c in accordance with some embodiments of the present disclosure. The semiconductor device structure 1c may have a structure similar to the semiconductor device structure 1a except that the barrier layer 60c of the semiconductor device structure 1c may enclose the nitride semiconductor layer 70. The barrier layer 60c may surround the nitride semiconductor layer 70. The barrier layer 60c may be in contact with the surface 702 of the nitride semiconductor layer 70. The barrier layer 60c may be conformally disposed on the nitride semiconductor layer 70.

Figure 4:
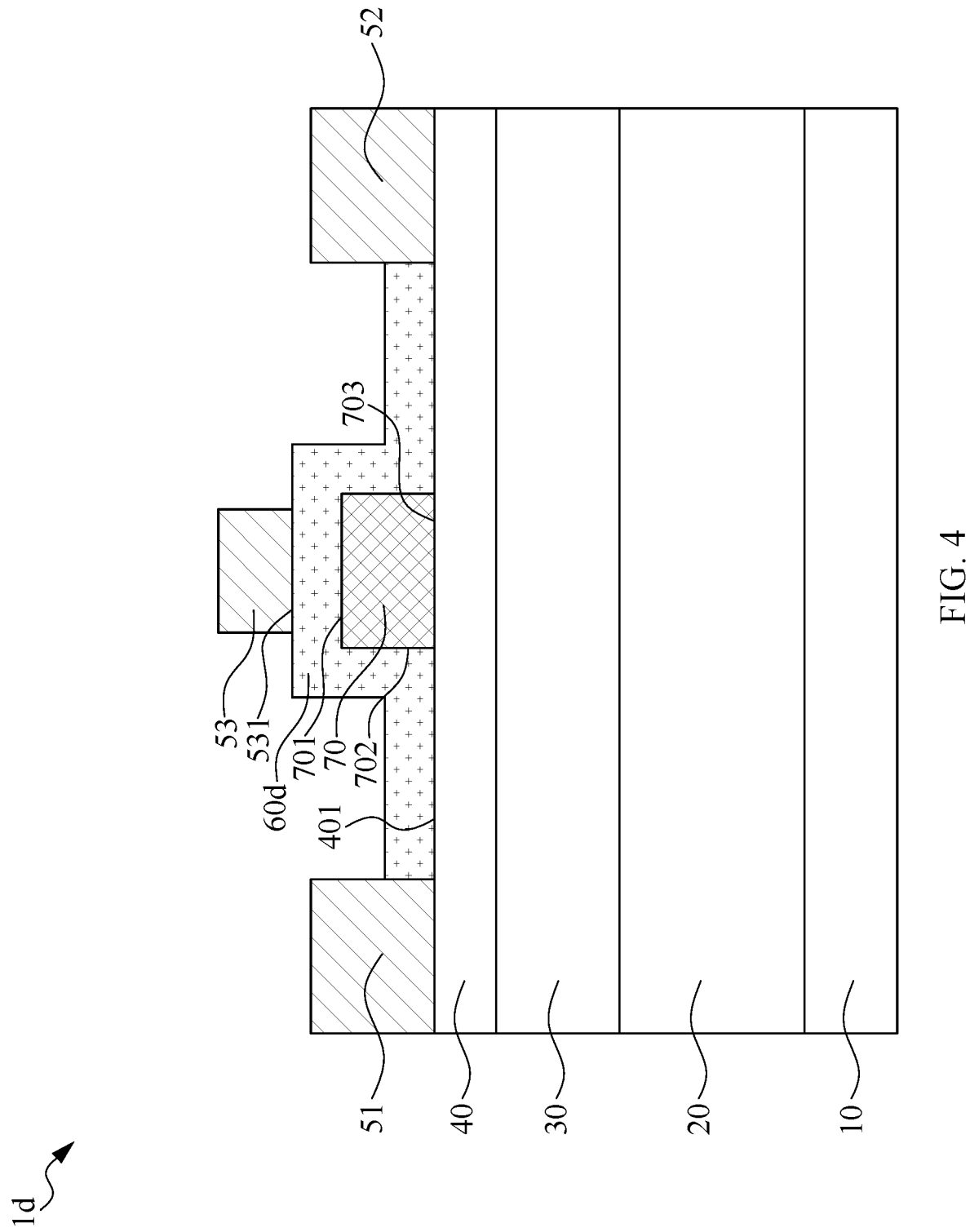
FIG. 4 is a cross-sectional view of a semiconductor device structure in accordance with some embodiments of the present disclosure.

FIG. 4 is a cross-sectional view of a semiconductor device structure 1d in accordance with some embodiments of the present disclosure. The semiconductor device structure 1d may have a structure similar to the semiconductor device structure 1c except that the barrier layer 60d of the semiconductor device structure 1d may be disposed on the nitride semiconductor layer 40. The barrier layer 60d may be in contact with the nitride semiconductor layer 40. The barrier layer 60d may be in contact with the a surface 401 (or an upper surface) of the nitride semiconductor layer 40. The barrier layer 60d may be in contact with the electrode 51. The barrier layer 60d may be in contact with the electrode 52. The barrier layer 60d may be disposed between the nitride semiconductor layer 70 and the electrode 51. The barrier layer 60d may be disposed between the nitride semiconductor layer 70 and the electrode 52.

Figure 5:
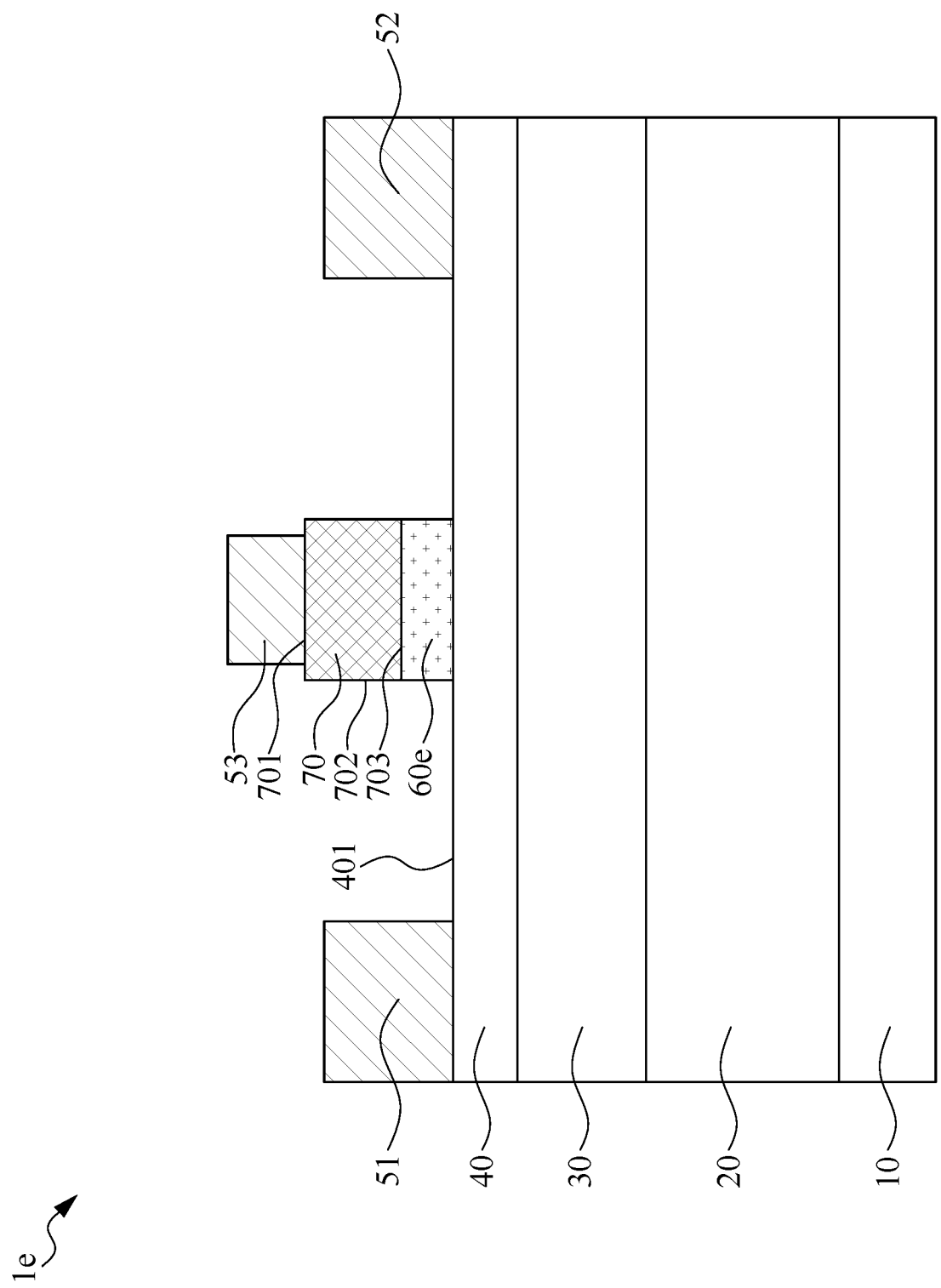
FIG. 5 is a cross-sectional view of a semiconductor device structure in accordance with some embodiments of the present disclosure.

FIG. 5 is a cross-sectional view of a semiconductor device structure 1e in accordance with some embodiments of the present disclosure.

The barrier layer 60e may be disposed between the nitride semiconductor layer 40 and the nitride semiconductor layer 70. The barrier layer 60e may be in contact with the surface 703 of the nitride semiconductor layer 70. The barrier layer 60e may not be in contact with the surface 701 of the nitride semiconductor layer 70. The barrier layer 60e may not be in contact with the surface 702 of the nitride semiconductor layer 70. The nitride semiconductor layer 70 may be separated from the nitride semiconductor layer 40 by the barrier layer 60e. The nitride semiconductor layer 70 may cover the barrier layer 60e. The nitride semiconductor layer 70 may completely cover the barrier layer 60e. The surface 702 of the nitride semiconductor layer 70 may be coplanar with the side surface of the barrier layer 60e.

Under high temperature reverse bias (HTRB), an electric field between the gate structure and the drain may incur impact ionization, generating a pair of hole and electron. This hole may be extracted by the gate structure through the depletion layer, which degrade the quality of the depletion layer. As HTRB is performed, the threshold voltage may shift irreversibly due to degradation of the depletion layer. Further, leak current may also be increased. In this embodiment, the barrier layer 60e is disposed between the nitride semiconductor layer 70 and the nitride semiconductor layer 40. The barrier layer 60e has a bandgap greater than that of the nitride semiconductor layer 40, which restrains hole(s) flowing from the nitride semiconductor layer 40 to the gate structure 53, thereby preventing the nitride semiconductor layer 70 from degradation. As a result, the threshold voltage of the semiconductor device structure 1e may keep invariable. The leak current of the semiconductor device structure 1e may keep invariable.

Figure 6:
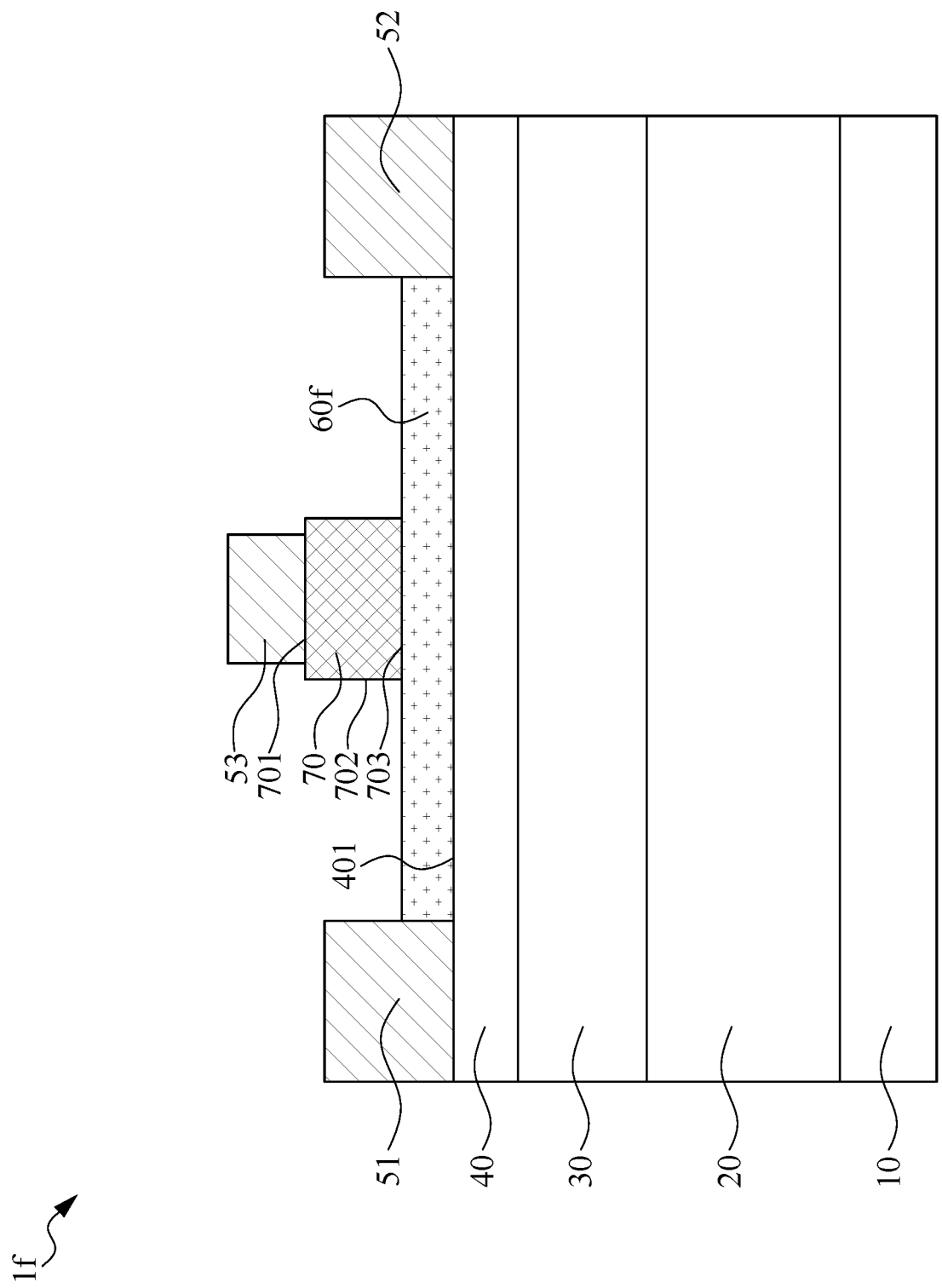
FIG. 6 is a cross-sectional view of a semiconductor device structure in accordance with some embodiments of the present disclosure.

FIG. 6 is a cross-sectional view of a semiconductor device structure 1f in accordance with some embodiments of the present disclosure. The semiconductor device structure 1f may have a structure similar to the semiconductor device structure 1e except that the barrier layer 60f of the semiconductor device structure 1f may extend from the electrode 51 to the electrode 52. A portion of the barrier layer 60f may be exposed from the nitride semiconductor layer 70. The nitride semiconductor layer 70 may cover a portion of the barrier layer 60f.

Figure 7:
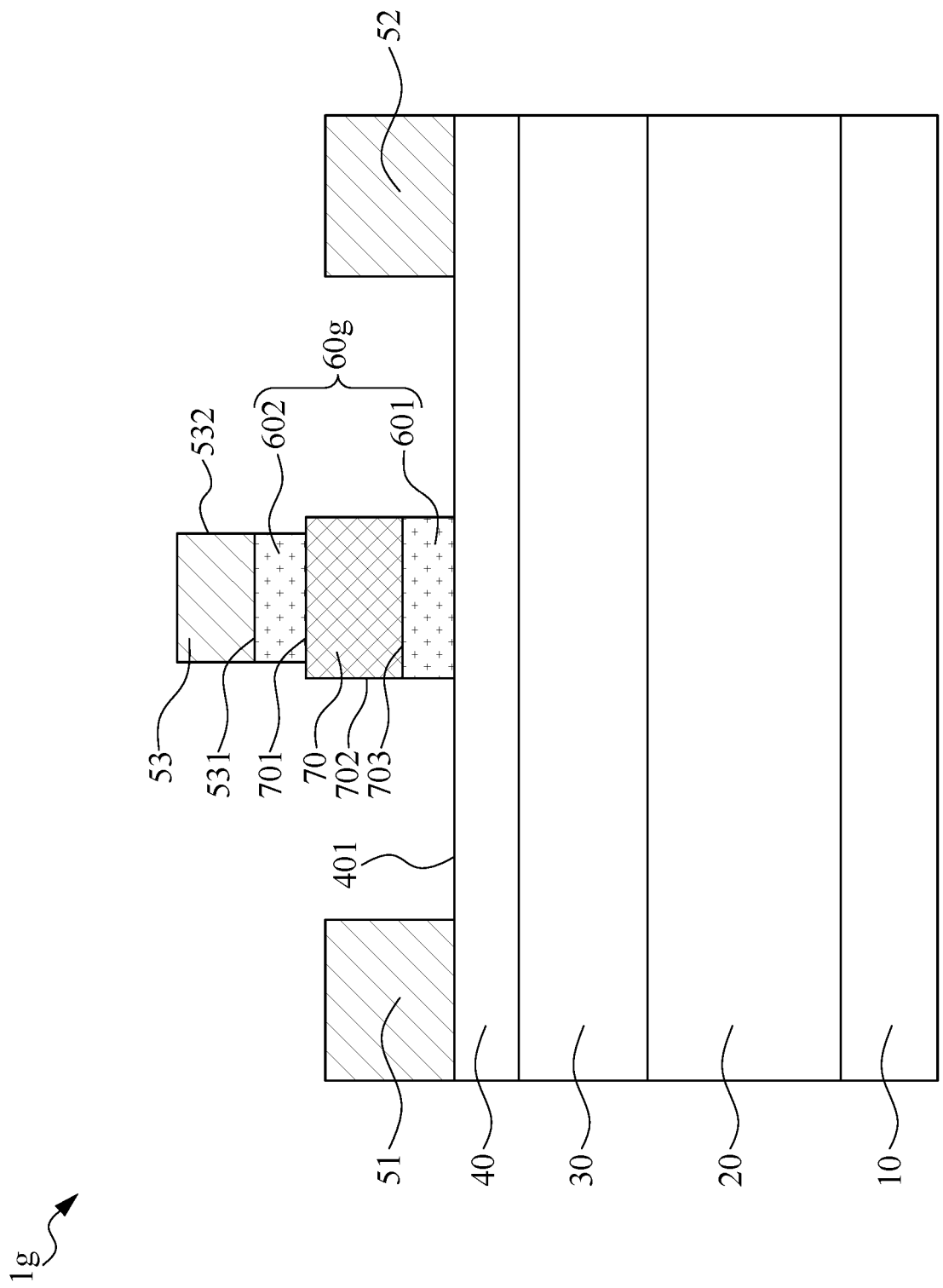
FIG. 7 is a cross-sectional view of a semiconductor device structure in accordance with some embodiments of the present disclosure.

FIG. 7 is a cross-sectional view of a semiconductor device structure 1g in accordance with some embodiments of the present disclosure. The semiconductor device structure 1g may have a structure similar to the semiconductor device structure 1f except that the barrier layer 60g may include a portion 601 and a portion 602.

The portion 601 may be separated from the portion 602. The portion 601 may be separated from the portion 602 by the nitride semiconductor layer 70. The portion 601 may be disposed between the nitride semiconductor layer 70 and the nitride semiconductor layer 40. The portion 602 may be disposed between the gate structure 53 and the nitride semiconductor layer 70. The portion 601 may be in contact with the surface 703 of the nitride semiconductor layer 70. The portion 602 may be in contact with the surface 701 of the nitride semiconductor layer 70. The nitride semiconductor layer 70 may be disposed between the portion 601 and the portion 602. The surface 702 of the nitride semiconductor layer 70 may be coplanar with the side surface of the portion 601. The surface 532 of the gate structure 53 may be coplanar with the side surface of the portion 602.

Figure 8:
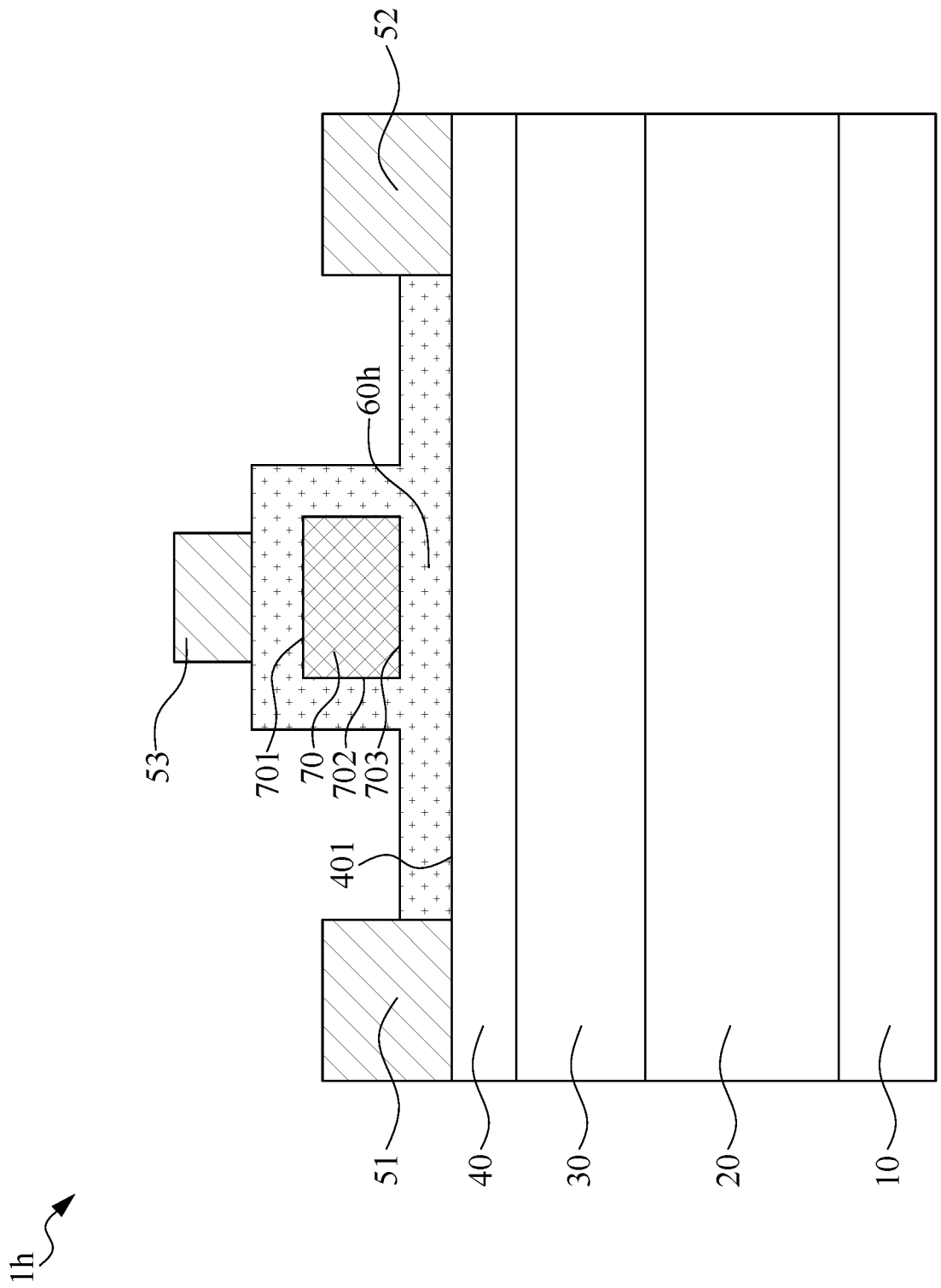
FIG. 8 is a cross-sectional view of a semiconductor device structure in accordance with some embodiments of the present disclosure.

FIG. 8 is a cross-sectional view of a semiconductor device structure 1h in accordance with some embodiments of the present disclosure. The semiconductor device structure 1h may have a structure similar to the semiconductor device structure 1g except that the barrier layer 60h of the semiconductor device structure 1h may be in contact with the surface 701, surface 702 and surface 703 of the nitride semiconductor layer 70. The nitride semiconductor layer 70 is enclosed by the barrier layer 60h. The nitride semiconductor layer 70 is sealed by the barrier layer 60h.

Figure 9:
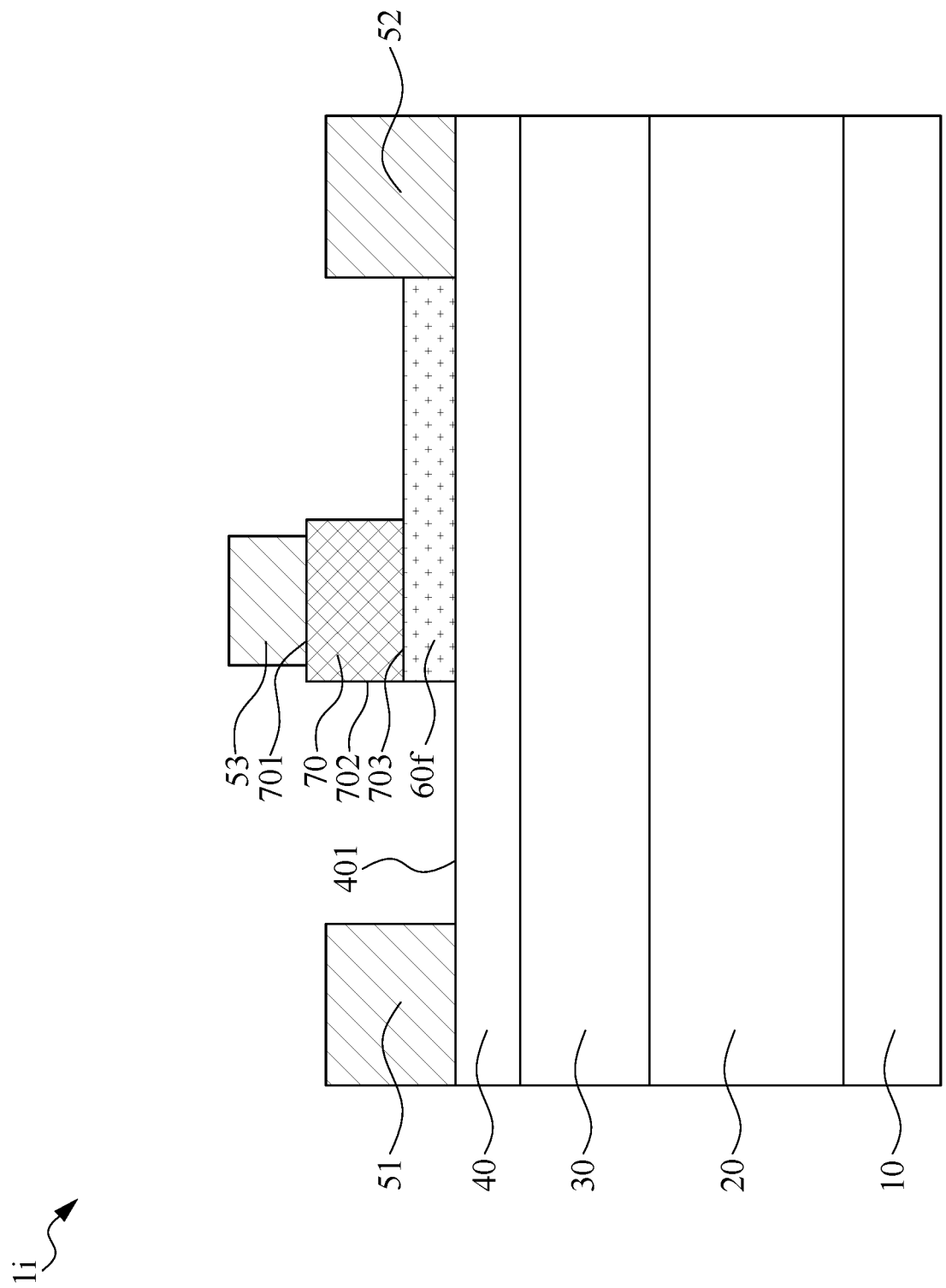
FIG. 9 is a cross-sectional view of a semiconductor device structure in accordance with some embodiments of the present disclosure.

FIG. 9 is a cross-sectional view of a semiconductor device structure 1i in accordance with some embodiments of the present disclosure. The semiconductor device structure 1i may have a structure similar to the semiconductor device structure 1f except that the barrier layer 60i may be free from in contact with the electrode 51. The portion of the nitride semiconductor layer 40 that is located between the nitride semiconductor layer 70 and the electrode 51 may be exposed from the barrier layer 60i. The barrier layer 60i may cover the portion of the nitride semiconductor layer 40 that is located between the nitride semiconductor layer 70 and the electrode 52.

FIG. 10 is a waveform schematic of voltage of a comparative semiconductor device structure 2 under HTGB. Voltage can be switched between $V_L$ and $V_H$. When voltage $V_L$ is performed, the semiconductor device structure 2 is at an off state. When voltage $V_H$ is performed, the semiconductor device structure 2 is at an on state. For example, under HTGB, a positive voltage may be imposed on the gate structure 53; the substrate 10 may be connected to ground; the electrode 51 may be connected to ground; the electrode 52 may be connected to ground.

Figure 10B:
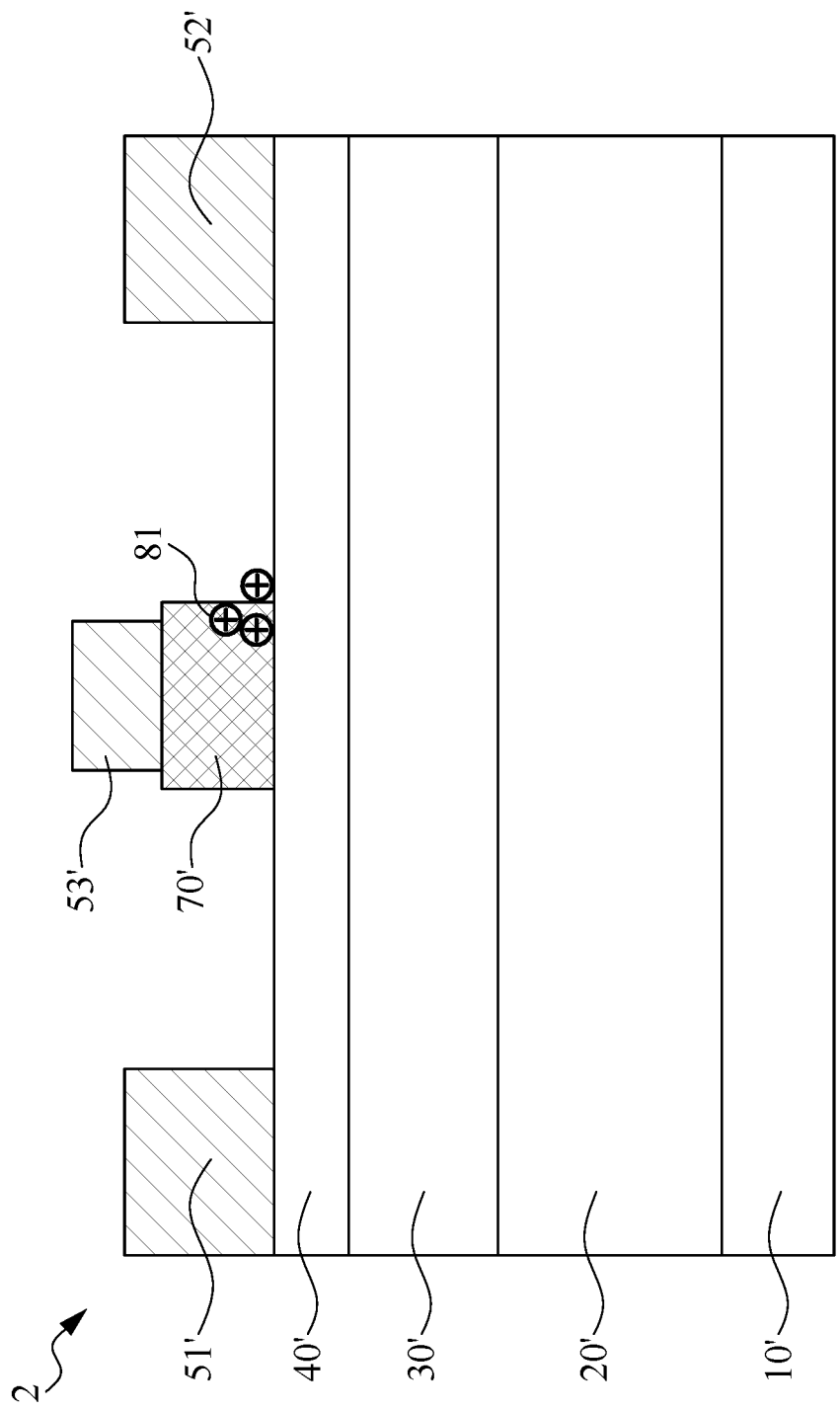
Figure 10C:
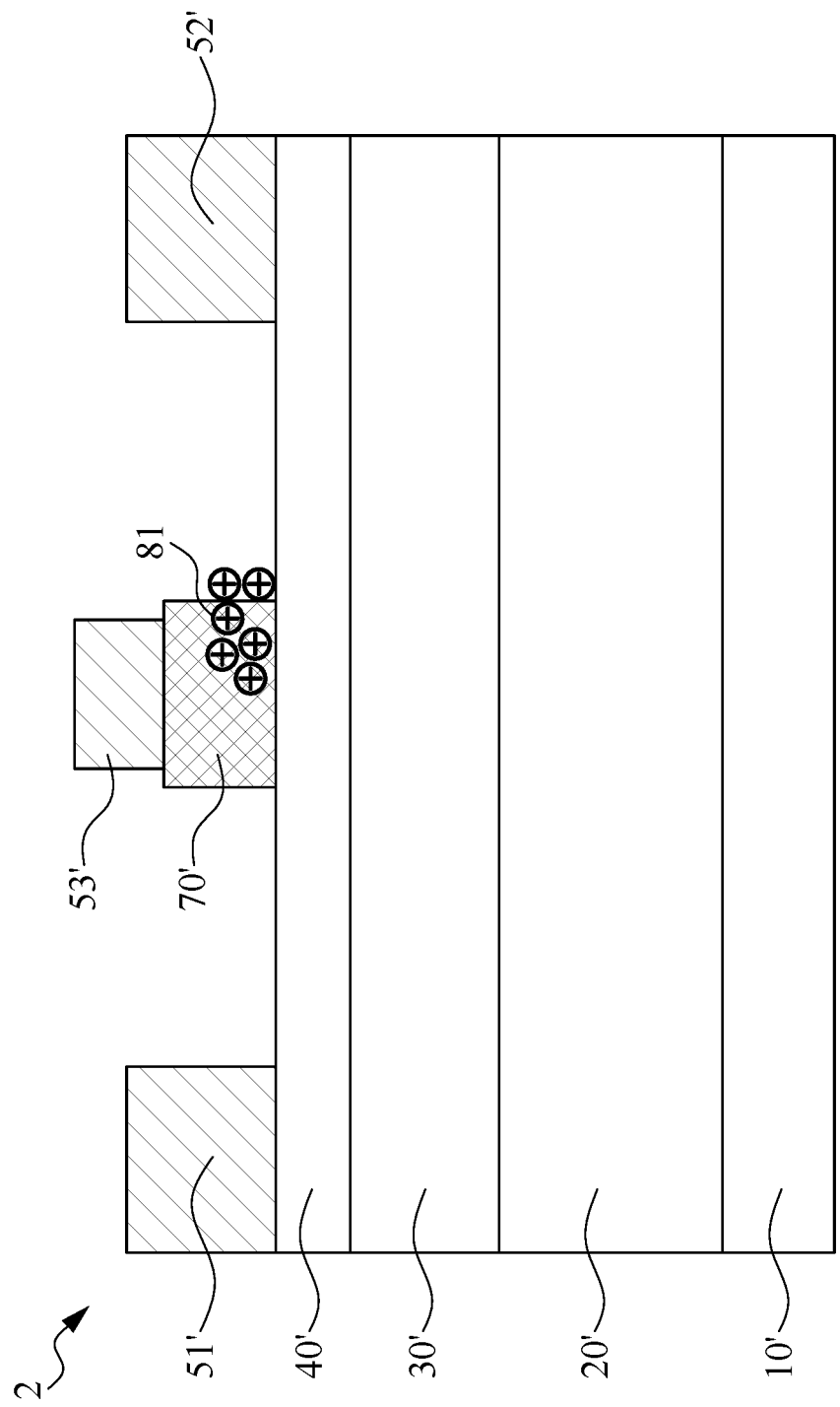

FIG. 10A, FIG. 10B and FIG. 10C illustrate accumulation of hole(s) of a comparative semiconductor device structure 2 at different times, such as times t(1), t(2) and t(3) of FIG. 10, respectively.

Referring to FIG. 10A, the semiconductor device structure 2 may include a substrate 10', buffer layer 20', nitride semiconductor layer 30', nitride semiconductor layer 40', electrode 51', electrode 52', gate structure 53' and nitride semiconductor layer 70', which may be the same as or similar to the substrate 10, buffer layer 20, nitride semiconductor layer 30, nitride semiconductor layer 40, electrode 51, electrode 52, gate structure 53 and nitride semiconductor layer 70. The semiconductor device structure 2 does not include a barrier layer between the nitride semiconductor layer 70' and the gate structure 53'. Under HTGB, a mount of hole(s) may be injected into the nitride semiconductor layer 70' from the gate structure 53', and then flow to the interface of the nitride semiconductor layer 30 and the nitride semiconductor layer 40, thereby depleting the 2DEG. At time t(1), almost of hole(s) may be consumed to deplete the 2DEG, and no hole(s) accumulates in the nitride semiconductor layer 70'.

Referring to FIG. 10B, at time t(2), the semiconductor device structure 2 is switched once after time t(1). Under HTGB, the speed of hole(s) flowing from the gate structure 53' to the nitride semiconductor layer 70' may be greater than the speed of the hole(s) flowing from the nitride semiconductor layer 70' to the nitride semiconductor layer 30'. As a result, some hole(s) 81 may accumulate in the nitride semiconductor layer 70'.

Referring to FIG. 10C, at time t(3), the semiconductor device structure 2 is switched twice after time t(1). As the number of switch of semiconductor device structure 2 becomes greater, more hole(s) 81 may accumulate in the nitride semiconductor layer 70'. As a result, the threshold voltage of the semiconductor device structure 2 may irreversibly shift.

Figures 11, 11A:
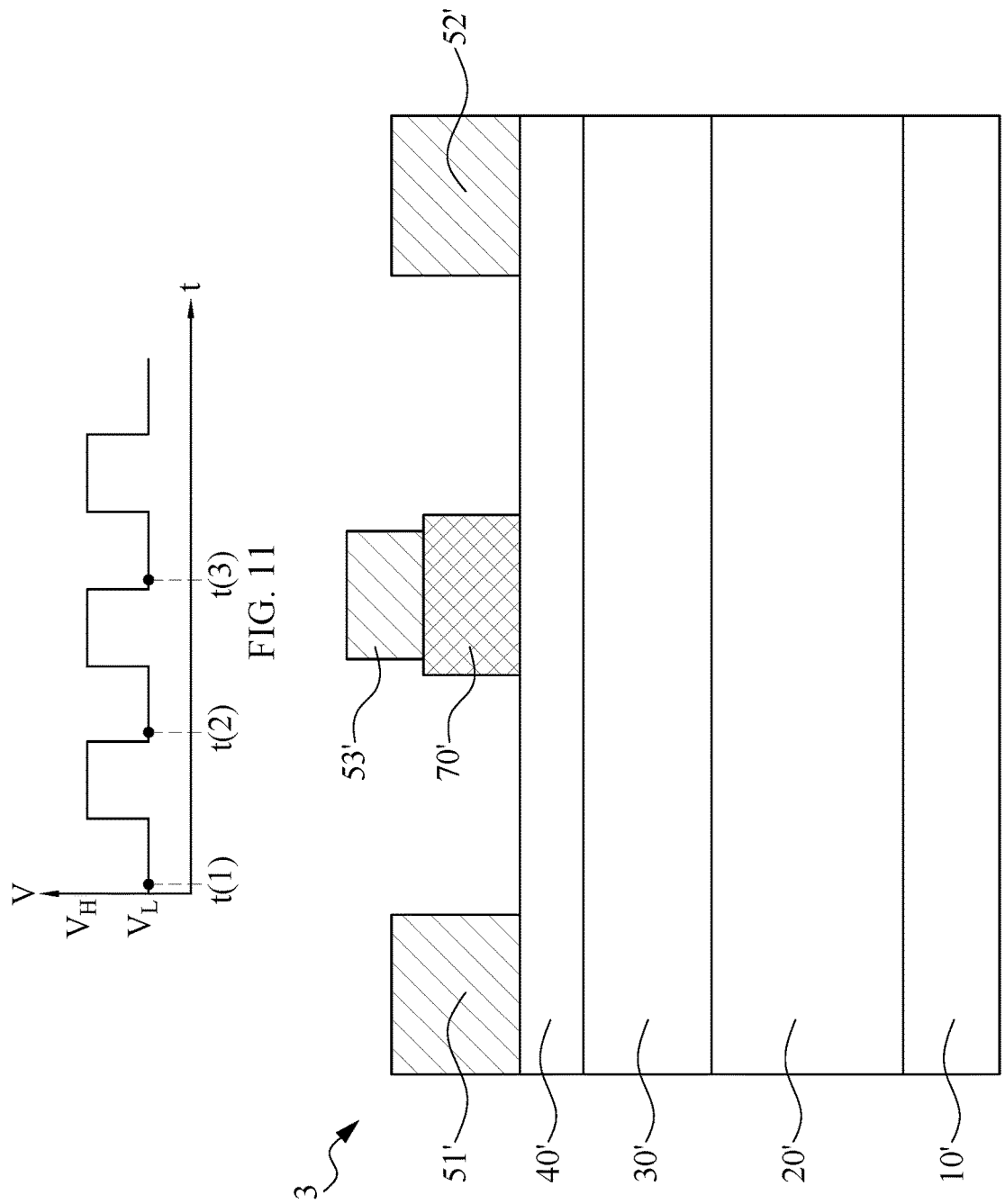
FIG. 11 is a waveform schematic of a comparative semiconductor device structure.
FIG. 11A, FIG. 11B and FIG. 11C illustrate states of distribution of hole(s) of a comparative semiconductor device structure at different times.

FIG. 11 is a waveform schematic of a comparative semiconductor device structure 3 under HTRB. Voltage can be switched between $V_L$ and $V_H$. When voltage $V_L$ is performed, the semiconductor device structure 3 is at an off state. When voltage $V_H$ is performed, the semiconductor device structure 3 is at an on state. For example, under HTRB, a positive voltage may be imposed on the electrode 52; the substrate 10 may be connected to ground; the gate structure 53 may be connected to ground; the electrode 51 may be connected to ground.

Figure 11B:
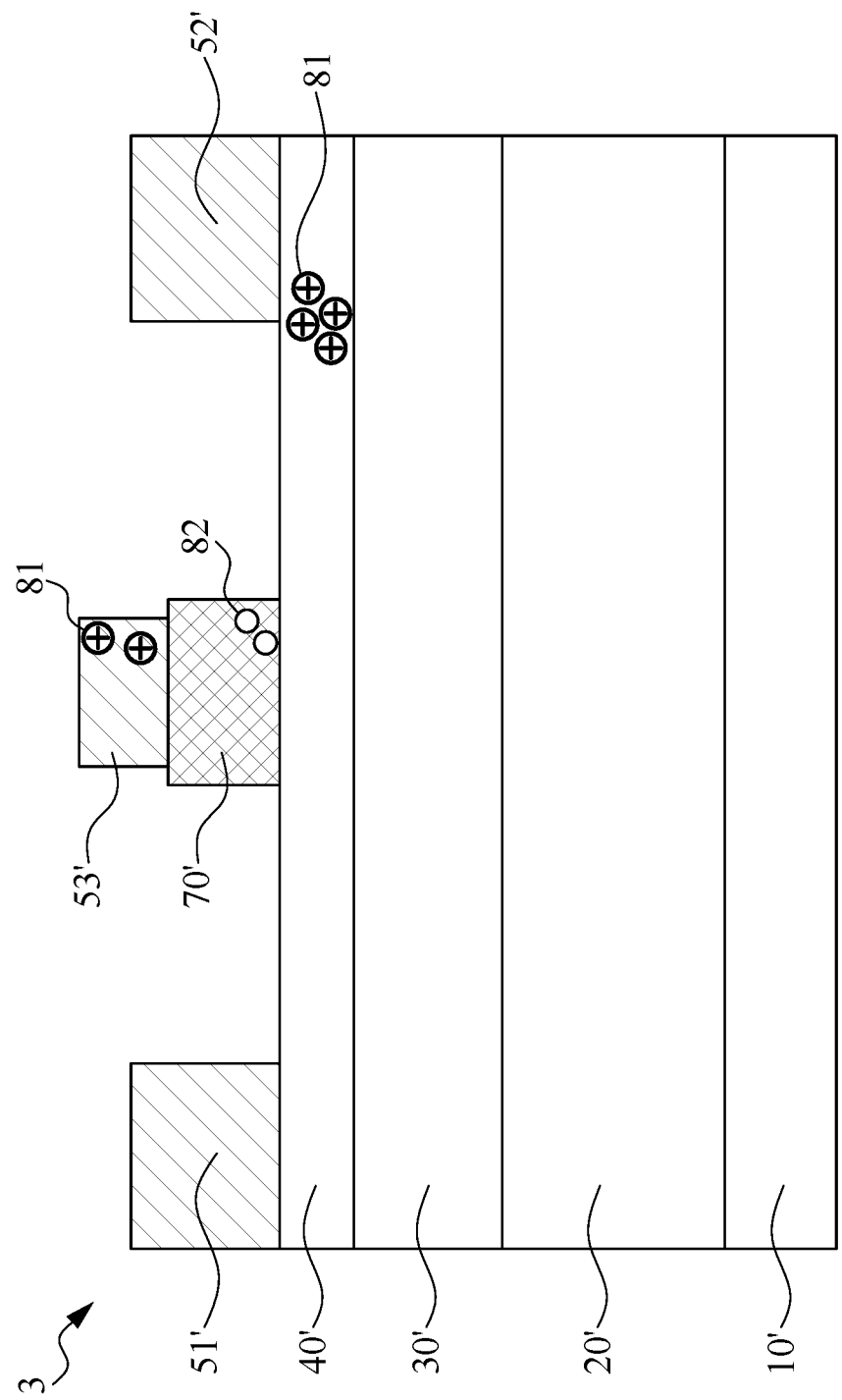
Figure 11C:
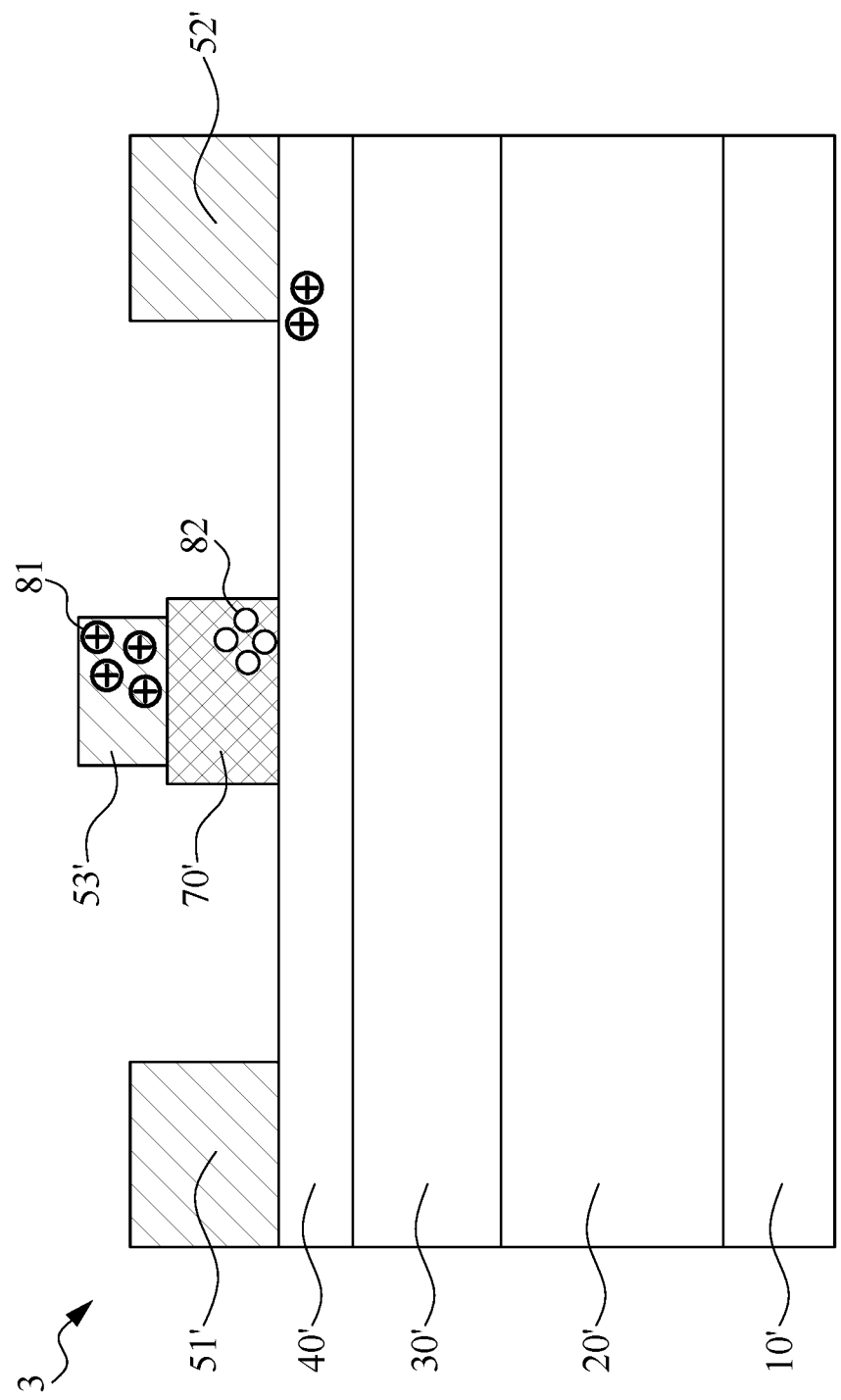

FIG. 11A, FIG. 11B and FIG. 11C illustrate accumulation of hole(s) of a comparative semiconductor device structure at different times, such as times t(1), t(2) and t(3) of FIG. 10, respectively.

Referring to FIG. 11A, the semiconductor device structure 3 may have a structure similar to or the same as that of the semiconductor device structure 2. Under HTRB, hole(s) may be generated due to impact ionization. Hole(s) may be extracted by the gate structure 53'. At time (1), since the semiconductor device structure 2 has not been switched yet, no hole(s) is generated due to impact ionization.

Referring to FIG. 11B, at time t(2), the semiconductor device structure 3 is switched once after time t(1). Hole(s) may be generated and then extracted by the gate structure 53'. When hole(s) 81 is extracted by the gate structure 53' through the nitride semiconductor layer 70', defects 82 may be generated in the nitride semiconductor layer 70', which degrades the nitride semiconductor layer 70'.

Referring to FIG. 11C, at time t(3), the semiconductor device structure 3 is switched twice after time t(1). As the number of switch of semiconductor device structure 3 becomes greater, more hole(s) 81 may be extracted by the gate structure 53' through the nitride semiconductor layer 70', generating more defects 82 in the nitride semiconductor layer 70'. As a result, the threshold voltage of the semiconductor device structure 3 may irreversibly shift.

FIG. 12A, FIG. 12B, FIG. 12C and FIG. 12D illustrate various stages of a method for manufacturing a semiconductor device structure in accordance with some embodiments of the present disclosure.

Figure 12A:
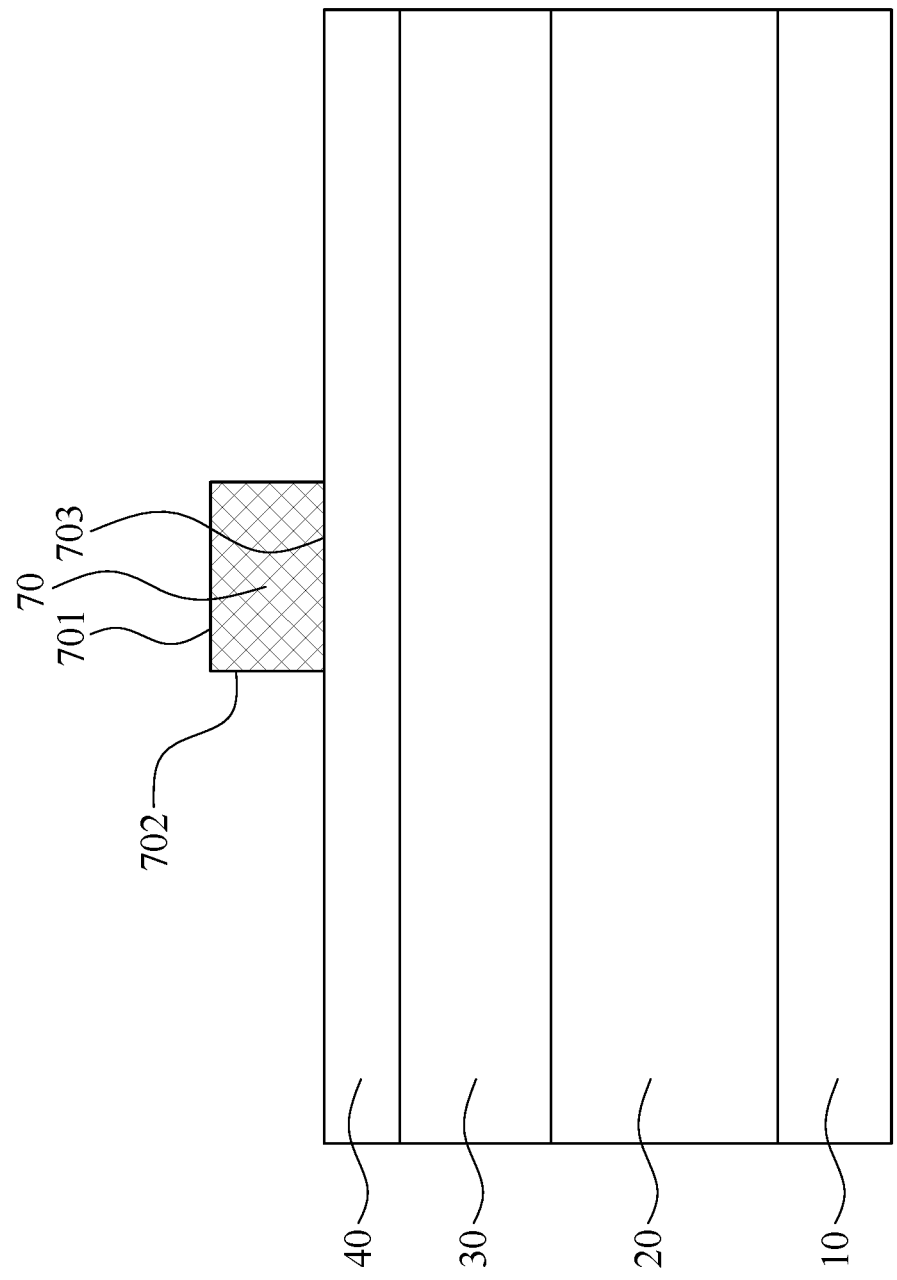
FIG. 12A, FIG. 12B, FIG. 12C and FIG. 12D illustrate various stages of a method for manufacturing a semiconductor device structure in accordance with some embodiments of the present disclosure.

Referring to FIG. 12A, the substrate 10 is provided. The buffer layer 20, the nitride semiconductor layer 30, the nitride semiconductor layer 40 and the nitride semiconductor layer 70 may be formed on the substrate 10. The buffer layer 20, the nitride semiconductor layer 30 and the nitride semiconductor layer 40, for example, may be formed through metal organic chemical vapor deposition (MOCVD), epitaxial growth or other suitable deposition steps. The nitride semiconductor layer 70 may be formed through the epitaxy technique.

Figure 12B:
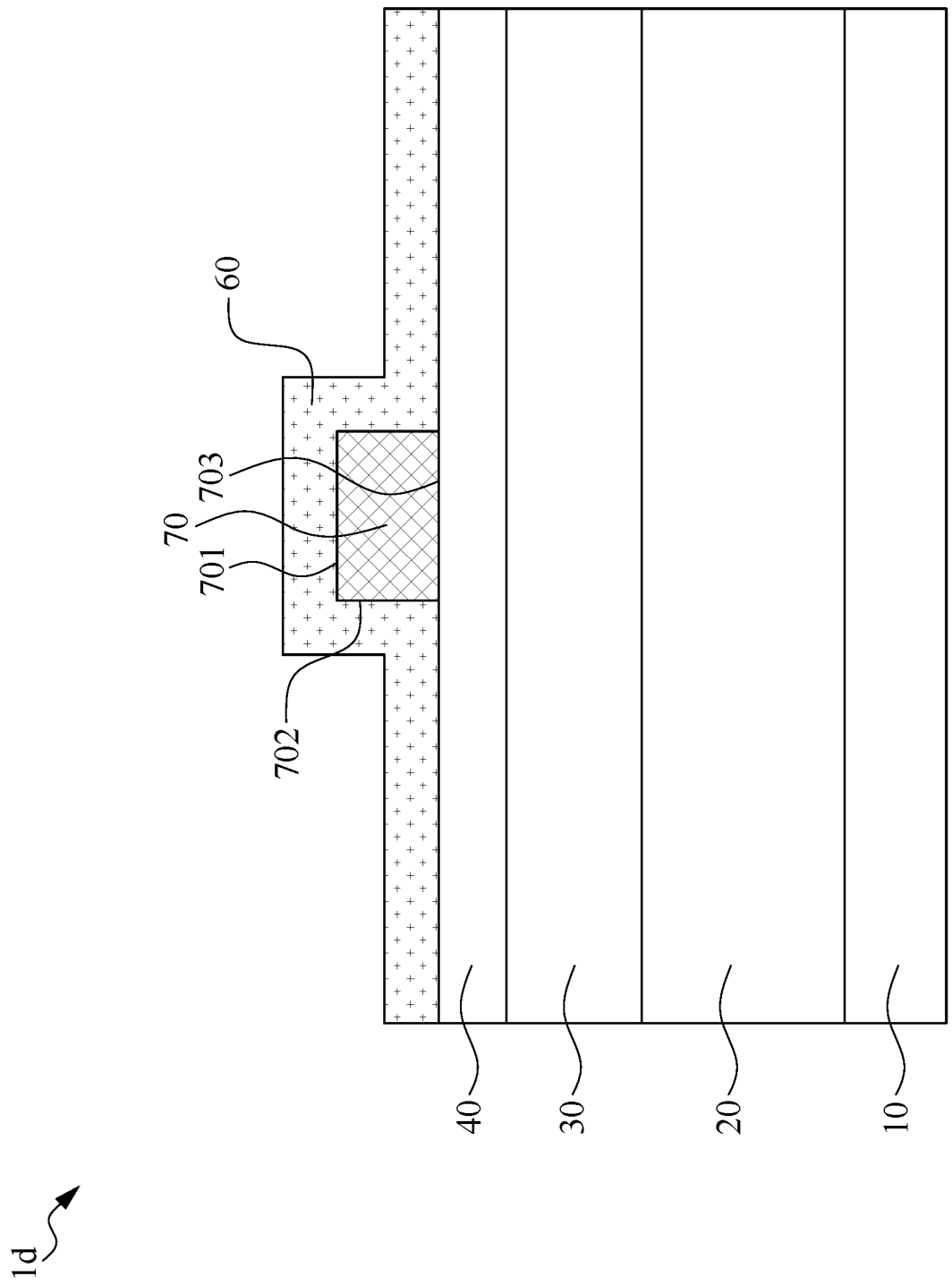

Referring to FIG. 12B, a semiconductor material 60 may be conformally formed on the nitride semiconductor layer 40 and the nitride semiconductor layer 70. The semiconductor material 60 may be deposited on the nitride semiconductor layer 40 after forming the nitride semiconductor layer 70. The semiconductor material 60 may be formed by a thermal growth, such as edge-defined film-fed growth (EFG). The semiconductor material 60 may also be formed by using plasma. For example, a group III semiconductor layer, such as a gallium layer, may be formed first, and then a plasma under oxygen-containing gas may be performed followed by an anneal with nitrogen-containing gas, thereby forming the semiconductor material 60. Oxygen-containing gas may include oxygen, ozone or other suitable gas. Nitrogen-containing gas may include nitrogen, ammonia or other suitable gas.

Figure 12C:
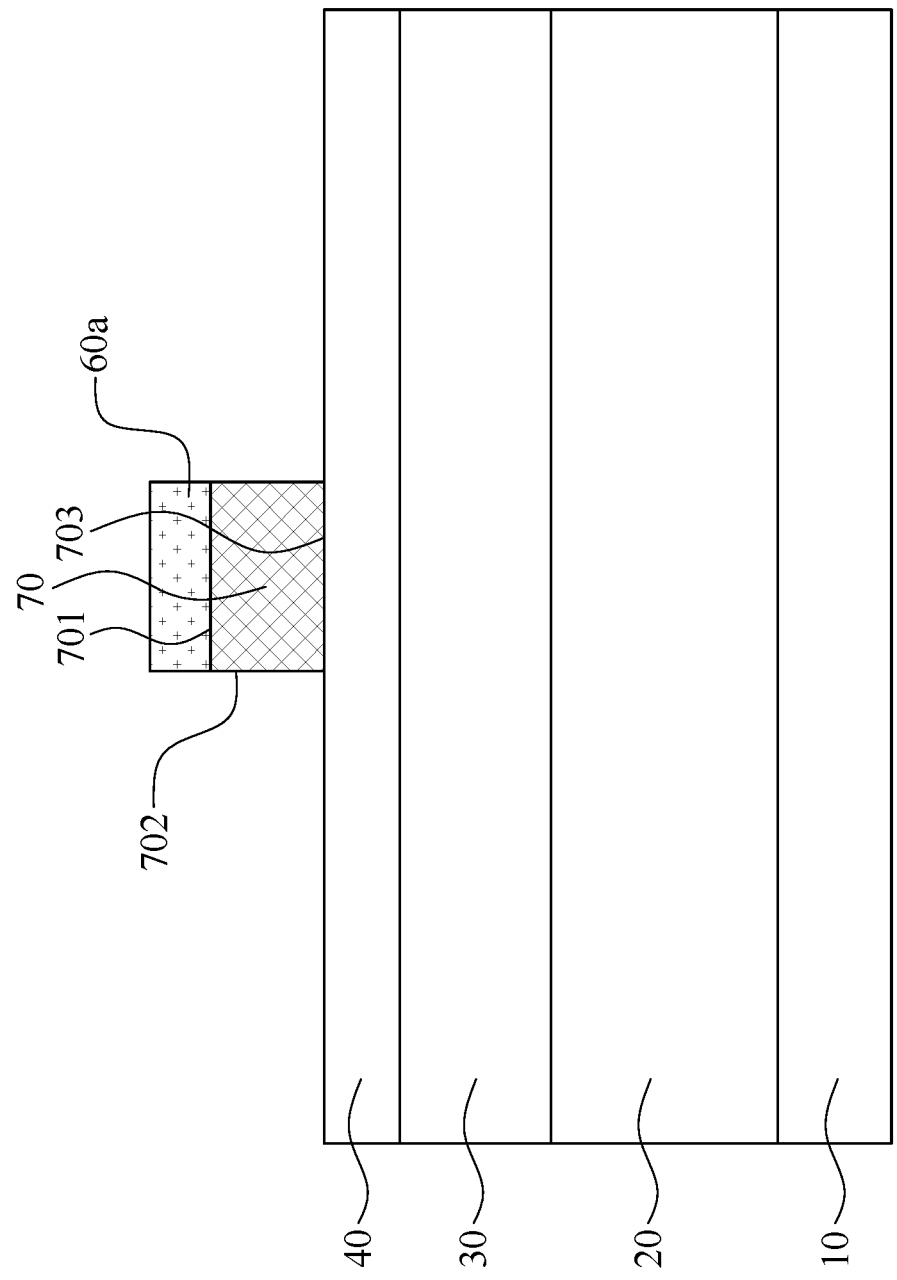

Referring to FIG. 12C, a portion of the semiconductor material 60 may be removed to form the barrier layer 60a. The semiconductor material 60 may be removed by, for example, a wet technique, dry technique or other suitable techniques.

Figure 12D:
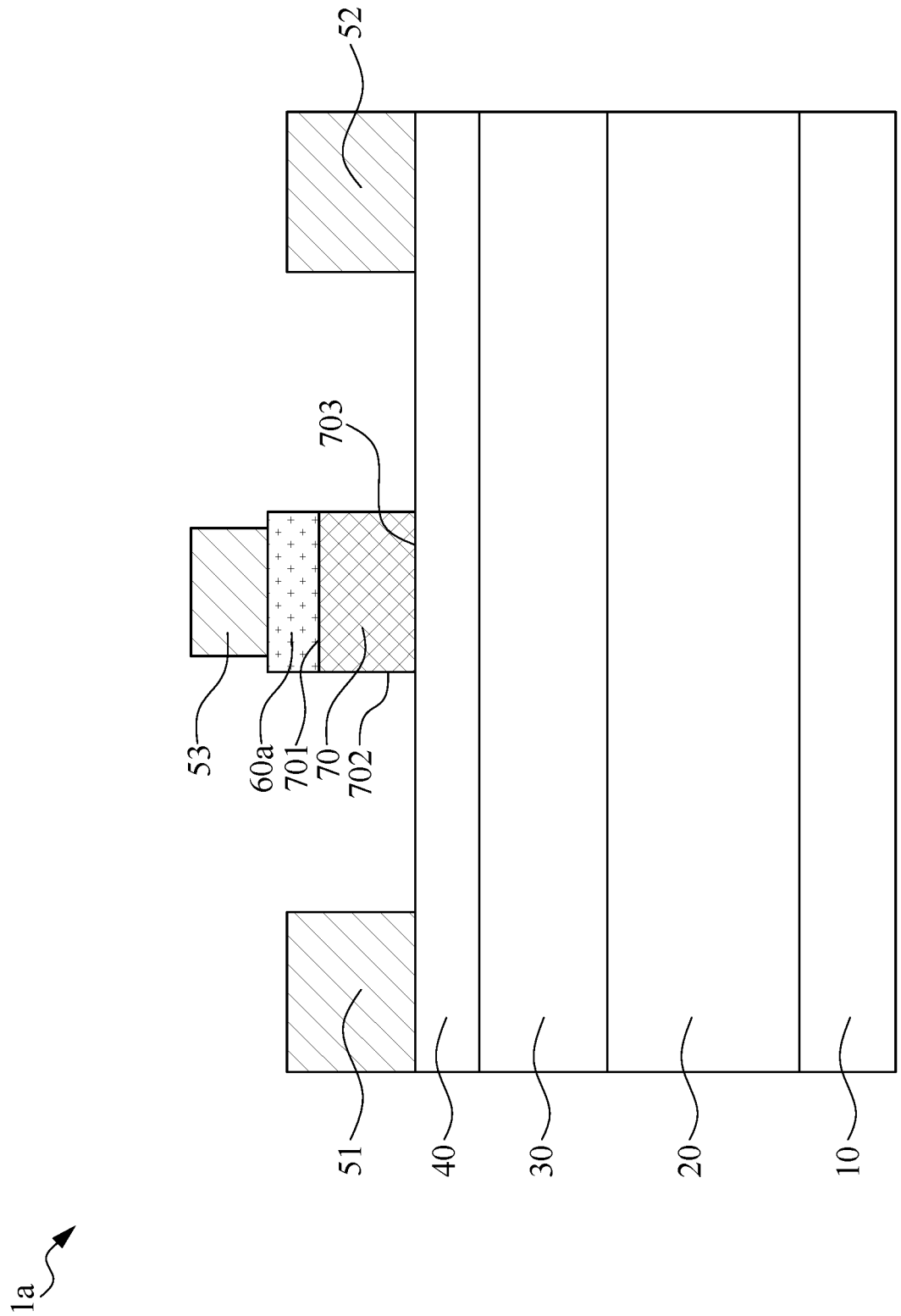

Referring to FIG. 12D, the electrode 51, the electrode 52 and the gate structure 53 may be formed to form a semiconductor device structure same or similar to the semiconductor device structure 1a as described and illustrated in FIG. 1.

Figure 13A:
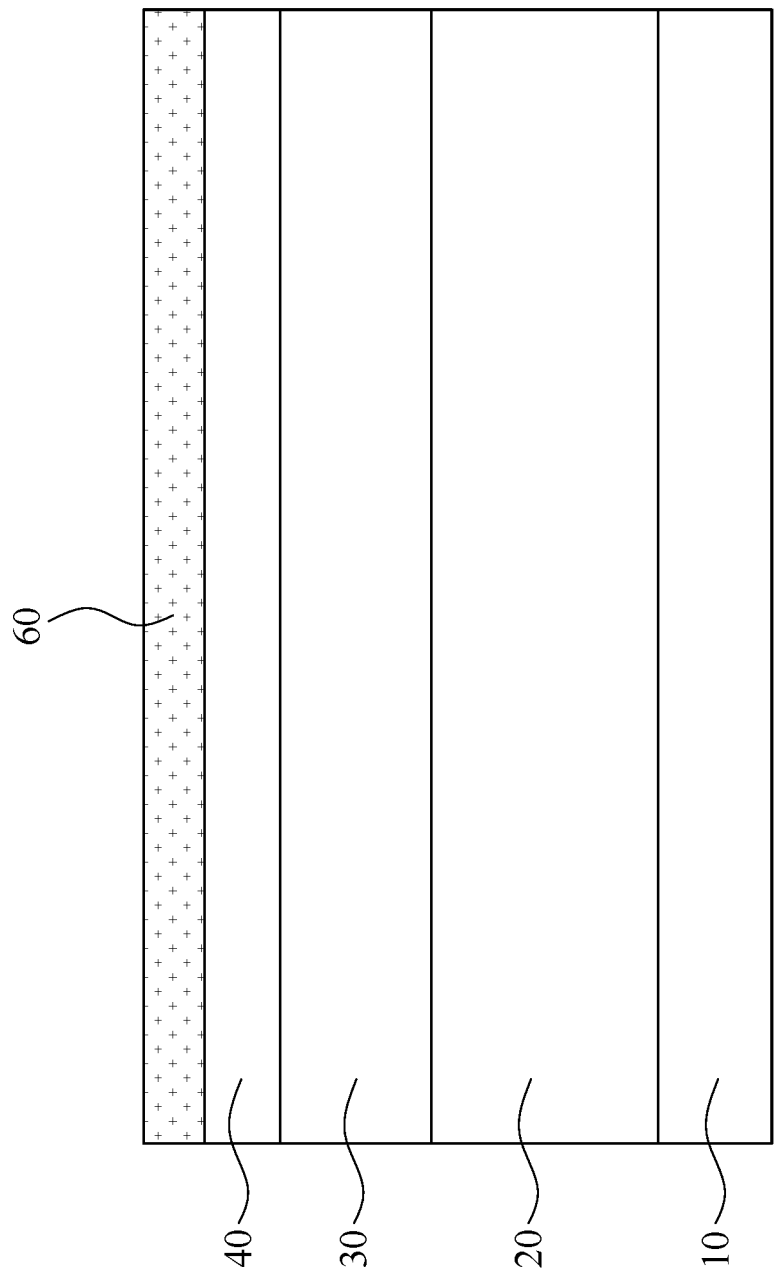
Figure 13C:
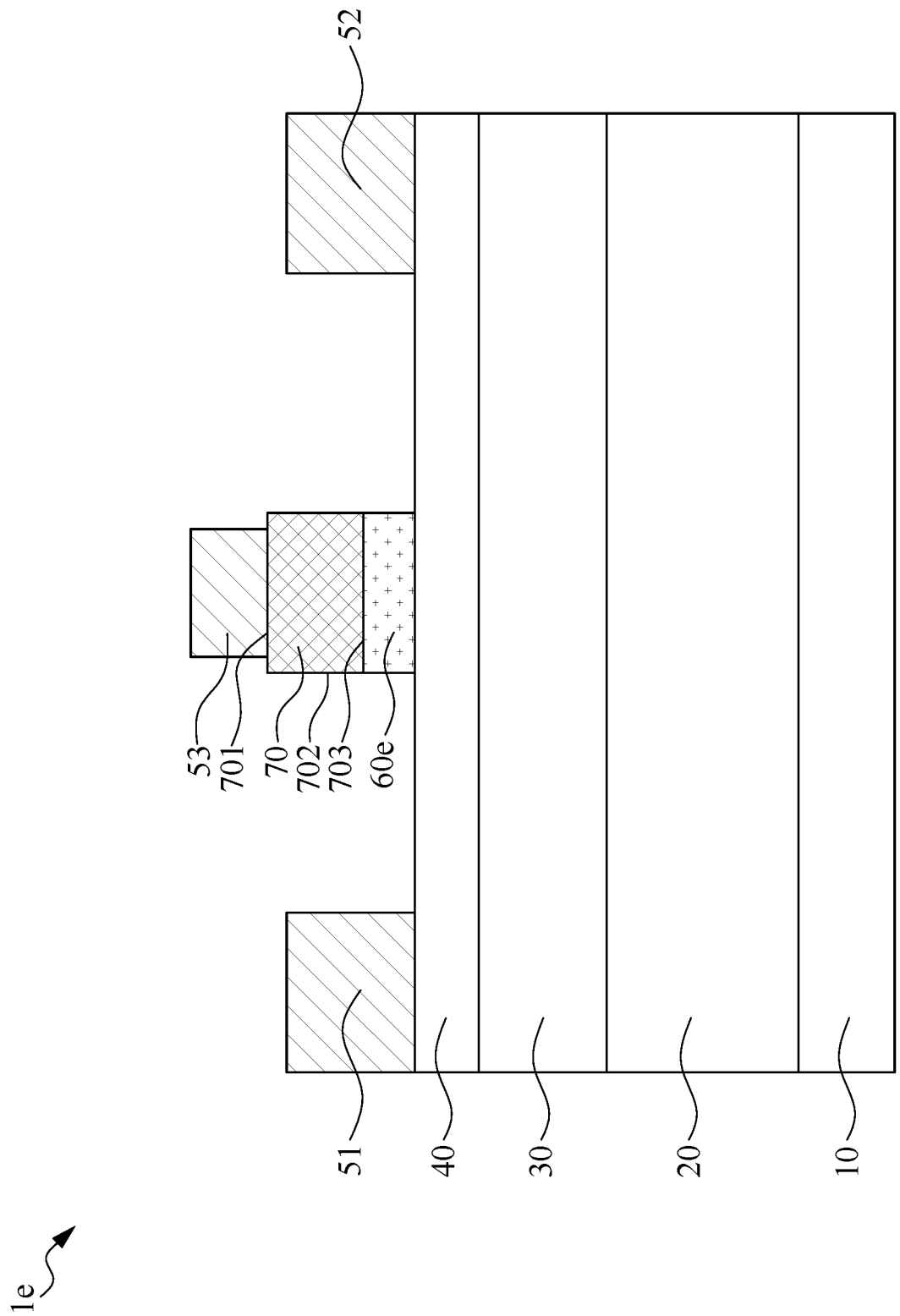

FIG. 13A, FIG. 13B and FIG. 13C illustrate various stages of a method for manufacturing a semiconductor device structure in accordance with some embodiments of the present disclosure.

Referring to FIG. 13A, the semiconductor material 60 may be formed on the nitride semiconductor layer 40. The semiconductor material 60 may be deposited on the nitride semiconductor layer 40 before forming the nitride semiconductor layer 70.

Referring to FIG. 13B, the semiconductor material 60 may be patterned to form the barrier layer 60e.

Referring to FIG. 13C, the electrode 51, the electrode 52, the gate structure 53 and the nitride semiconductor layer 70 may be formed to form a semiconductor device structure same or similar to the semiconductor device structure 1e as described and illustrated in FIG. 5.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 80 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to a given value or range, the term "about" generally refers to within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 within 5 within 1 or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device structure, comprising:
   a substrate;
   a first nitride semiconductor layer disposed on the substrate;
   a second nitride semiconductor layer disposed on the first nitride semiconductor layer and having a bandgap greater than that of the first nitride semiconductor layer;
   a third nitride semiconductor layer doped with impurity and disposed on the second nitride semiconductor layer;
   a source electrode;
   a drain electrode;
   a barrier layer in contact with the third nitride semiconductor layer and having a bandgap greater than that of the second nitride semiconductor layer; and
   a gate structure disposed on the third nitride semiconductor layer,
   wherein the source electrode and drain electrode are disposed on the second nitride semiconductor layer, and contact with an upper surface of the second nitride semiconductor layer, and
   wherein the barrier layer is in contact with the drain electrode, and is spaced away from the source electrode.

2. The semiconductor device structure of claim 1, wherein a band gap of the barrier layer is greater than a band gap of the third nitride semiconductor layer.

3. The semiconductor device structure of claim 1, wherein a material of the barrier layer comprises gallium oxide, gallium oxynitride, diamond, aluminum nitride or a combination thereof.

4. The semiconductor device structure of claim 1, wherein the barrier layer covers an upper surface of the second nitride semiconductor layer.

5. The semiconductor device structure of claim 1, wherein the barrier layer is disposed between the third nitride semiconductor layer and the second nitride semiconductor layer.

6. The semiconductor device structure of claim 1, wherein the barrier layer covers a lower surface of the third nitride semiconductor layer.

7. A semiconductor device structure, comprising:
   a substrate;
   a first nitride semiconductor layer disposed on the substrate;
   a second nitride semiconductor layer disposed on the first nitride semiconductor layer and having a bandgap greater than that of the first nitride semiconductor layer;
   a third nitride semiconductor layer disposed on the second nitride semiconductor layer,
   wherein the third nitride semiconductor layer comprises a first surface adjacent to the second nitride semiconductor layer and a second surface away from the second nitride semiconductor layer;
   a source electrode;
   a drain electrode;
   a gate structure disposed on the second surface of the third nitride semiconductor layer; and
   a barrier layer disposed between the gate structure and the second nitride semiconductor layer, wherein the barrier layer has a bandgap greater than that of the second nitride semiconductor layer,
   wherein the source electrode and drain electrode are disposed on the second nitride semiconductor layer, and contact with an upper surface of the second nitride semiconductor layer, and
   wherein the barrier layer is in contact with the drain electrode, and is spaced away from the source electrode.

8. The semiconductor device structure of claim 7, wherein a band gap of the barrier layer is greater than a band gap of the third nitride semiconductor layer.

9. The semiconductor device structure of claim 7, wherein a material of the barrier layer comprises gallium oxide, gallium oxynitride, diamond, aluminum nitride or a combination thereof.

10. A method for manufacturing a semiconductor device structure, comprising:
    providing a substrate;
    forming a first nitride semiconductor layer on the substrate;
    forming a second nitride semiconductor layer on the first nitride semiconductor layer, wherein the second nitride semiconductor layer has a bandgap greater than that of the first nitride semiconductor layer;
    forming a third nitride semiconductor layer on the second nitride semiconductor layer;
    forming a barrier layer on the third nitride semiconductor layer, wherein the barrier layer has a bandgap greater than that of the second nitride semiconductor layer;
    forming a gate structure on the third nitride semiconductor layer; and
    forming a source electrode and a drain electrode on the second nitride semiconductor layer,
    wherein the source electrode and drain electrode contact with an upper surface of the second nitride semiconductor layer, and
    wherein the barrier layer is in contact with the drain electrode, and is spaced away from the source electrode.

11. The method of claim 10, wherein forming the barrier layer on the third nitride semiconductor layer comprises:
    forming a group III semiconductor layer on the third nitride semiconductor layer;
    treating the group III semiconductor layer with a first gas comprising oxygen; and
    annealing the group III semiconductor layer with a second gas comprising nitrogen.

* * * * *